(12) United States Patent
Yaegashi

(10) Patent No.: US 7,888,856 B2
(45) Date of Patent: Feb. 15, 2011

(54) ORGANIC ELECTROLUMINESCENCE DEVICE AND DISPLAY APPARATUS CONTAINING THE SAME, METHOD FOR MAKING ORGANIC ELECTROLUMINESCENCE DEVICE AND METHOD FOR MAKING DISPLAY APPARATUS

(75) Inventor: Hiroyuki Yaegashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 624 days.

(21) Appl. No.: 10/594,603

(22) PCT Filed: Mar. 29, 2004

(86) PCT No.: PCT/JP2004/004415
§ 371 (c)(1),
(2), (4) Date: Feb. 12, 2007

(87) PCT Pub. No.: WO2005/094134
PCT Pub. Date: Oct. 6, 2005

(65) Prior Publication Data
US 2008/0036366 A1 Feb. 14, 2008

(51) Int. Cl.
*H01J 1/64* (2006.01)
(52) U.S. Cl. ......................... 313/503; 445/24
(58) Field of Classification Search ............... 313/503; 445/24
See application file for complete search history.

(56) References Cited

U.S. PATENT DOCUMENTS

| | | | |
|---|---|---|---|
| 6,538,374 B2 * | 3/2003 | Hosokawa | 313/506 |
| 6,882,105 B2 * | 4/2005 | Murakami et al. | 313/506 |
| 2002/0130991 A1 * | 9/2002 | Kamijo | 349/106 |
| 2003/0067266 A1 | 4/2003 | Kim et al. | |
| 2003/0156239 A1 * | 8/2003 | Inoue et al. | 349/113 |
| 2004/0017153 A1 | 1/2004 | Nishikawa | |
| 2004/0113544 A1 * | 6/2004 | Murakami et al. | 313/504 |
| 2004/0256979 A1 * | 12/2004 | Murakami et al. | 313/503 |
| 2005/0174039 A1 | 8/2005 | Nishikawa et al. | |
| 2006/0262254 A1 | 11/2006 | Inoue et al. | |

FOREIGN PATENT DOCUMENTS

| | | |
|---|---|---|
| CN | 1444426 A | 9/2003 |
| EP | 1 244 153 A2 | 9/2002 |
| JP | 64-38998 A | 2/1989 |
| JP | 11-329753 A | 11/1999 |
| JP | 2001-85163 A | 3/2001 |
| JP | 2002-8870 A | 1/2002 |
| JP | 2002-299057 A | 10/2002 |
| JP | 2002-318553 A | 10/2002 |
| JP | 2003-123965 A | 4/2003 |
| JP | 2003-202587 A | 7/2003 |
| JP | 2004-14360 A | 1/2004 |
| JP | 2004-192876 A | 7/2004 |
| JP | 2005-209413 A | 8/2005 |

* cited by examiner

*Primary Examiner*—Peter Macchiarolo
(74) *Attorney, Agent, or Firm*—Birch, Stewart, Kolasch & Birch, LLP

(57) ABSTRACT

An organic electroluminescence device includes a light reflection film 12 which is formed on an insulating substrate 10; an anode electrode 16 which has a transparent conductive film 14 which is formed on the light reflection film 12 so as to cover the light reflection film 12; an organic electroluminescence layer 18 which is formed on the anode electrode 16; and a cathode electrode 20 which is formed on the organic electroluminescence layer 18 and has light transmittance. Thereby, a high luminous efficiency can be realized without involving degradation of the device characteristics.

14 Claims, 18 Drawing Sheets

ORGANIC ELECTROLUMINESCENCE DEVICE AND DISPLAY APPARATUS CONTAINING THE SAME, METHOD FOR MAKING ORGANIC ELECTROLUMINESCENCE DEVICE AND METHOD FOR MAKING DISPLAY APPARATUS

TECHNICAL FIELD

The present invention pertains to an organic electroluminescence device and a manufacturing method therefor, as well as a display apparatus and a manufacturing method therefor, and particularly relates to an organic electroluminescence device excellent in luminous efficiency and a manufacturing method therefor, as well as a display apparatus having such an organic electroluminescence device.

BACKGROUND ART

In recent years, display apparatuses using an organic electroluminescence (EL) device have attracted great attention as display apparatuses which can be made thinner and more lightweight, as compared to conventional CRTs and LCDs. The organic electroluminescence device is of a self-emitting type, and thus it offers various advantages such as providing high visibility, being free from angle-of-field dependency, allowing use of a film substrate having flexibility, being thinner and more lightweight compared to a liquid crystal display apparatus, and the like. Further, in order to realize a display with higher fineness, development of an active matrix type display apparatus having a switching device, such as a thin film transistor, or the like, together with the organic electroluminescence device has been under progress.

In a conventional display apparatus which uses an organic electroluminescence device, an anode electrode made from a transparent conductive film such as ITO (indium oxide doped with tin) is formed on an insulating substrate made from, for example, a glass substrate. On the anode electrode, an organic electroluminescence layer including a luminescence layer where an electron and a hole are recombined to generate light is formed. On the organic electroluminescence layer, a cathode electrode made from an Al (aluminum) film, an Mg (magnesium)-Ag (silver) alloy film, or the like, is formed. Thus, on the insulating substrate, the organic electroluminescence device having the anode electrode, the organic electroluminescence layer, and the cathode electrode is formed. In addition, in the active matrix type display apparatus, a switching device, such as a thin film transistor, or the like, which controls the driving voltage to be applied to the organic electroluminescence device is formed between the insulating substrate and the organic electroluminescence device. The display apparatus having such a structure is a so-called bottom emission type apparatus, wherein the light generated in the luminescence layer in the organic electroluminescence layer is taken out from the insulating substrate side.

When full colorization is to be realized with the above-mentioned display apparatus, luminescence layers which are different in luminescence wavelength are formed in the pixel regions. For example, a vapor deposition mask in which apertures for the pixel regions are formed is tightly contacted with the substrate, and by displacing the vapor deposition mask in the order of RGB, for example, the luminescence layers for generating the respective RGB colors are formed.

In the bottom emission type display apparatus, the light generated in the organic electroluminescence device is taken out from the insulating substrate side, as described above. Therefore, in the case where a switching device is formed between the insulating substrate and the organic electroluminescence device, there is a problem that the luminescence area in one pixel is substantially reduced due to the existence of the switching device, which makes it impossible to obtain a high luminous efficiency.

Attempts to eliminate this problem of luminous efficiency have been made by adopting the so-called top emission type structure, wherein the light generated in the luminescence layer is taken out from the side opposite to the insulating substrate side on which the switching device is formed, in other words, from the cathode electrode side (see, for example, patent documents 1 and 2).

In the top emission type display apparatus as disclosed in patent document 1, a cathode electrode having light transmittance is used, and as an anode electrode, a Cr (chromium) thin film having light reflectivity is used, whereby the light generated in the luminescence layer is reflected to the cathode electrode side, and from the cathode electrode, the light is taken out. However, since the light reflectance of Cr is not particularly high, the light generated in the luminescence layer cannot be sufficiently reflected to the cathode electrode side.

In addition, in the top emission type display apparatus as disclosed in patent document 2, an electrode layer made from an ITO film is formed directly on a reflection layer made from an Al film. However, the electrical connection between the Al film and the ITO film is not good, and thus it has been difficult to use the reflection layer as the electrode.

Therefore, if a switching device is provided under the reflection layer, establishing a connection between the electrode layer and the switching device has been difficult.

An object of the present invention is to provide an organic electroluminescence device which can realize a high luminous efficiency, and a manufacturing method therefor, as well as a display apparatus having such an organic electroluminescence device.

Patent document 1: Japanese Patent Laid-Open Publication No. 2001-85163

Patent document 2: Japanese Patent Laid-Open Publication No. 11-329753/1999

DISCLOSURE OF THE INVENTION

One aspect of the present invention provides an organic electroluminescence device, comprising:

an anode electrode comprising a first conductive film which is formed on a substrate and has light reflectivity, and a second conductive film which is formed on the first conductive film so as to cover the first conductive film and has light transmittance;

an organic electroluminescence layer which is formed on the anode electrode; and a cathode electrode which is formed on the organic electroluminescence layer and has light transmittance.

In addition, another aspect of the present invention provides an organic electroluminescence device, comprising:

an anode electrode comprising a first conductive film which is formed on a substrate and has light reflectivity, a second conductive film which is formed on the first conductive film and has light transmittance, and a third conductive film which is partially formed between the first conductive film and the second conductive film and is electrically connected to each of the first conductive film and the second conductive film;

an organic electroluminescence layer which is formed on the anode electrode; and a cathode electrode which is formed on the organic electroluminescence layer and has light transmittance.

In addition, still another aspect of the present invention provides an organic electroluminescence device, comprising:

a first conductive film which is formed on a substrate and had light reflectivity;

an insulating layer which is formed on the first conductive film and has light transmittance;

an anode electrode which is formed on the insulating layer and comprises a second conductive film having light transmittance;

an organic electroluminescence layer which is formed on the anode electrode; and a cathode electrode which is formed on the organic electroluminescence layer and has light transmittance.

In addition, still another aspect of the present invention provides a manufacturing method for an organic electroluminescence device, comprising step of:

forming on a substrate, an anode electrode which comprises a first conductive film having light reflectivity, and a second conductive film which is formed on the first conductive film so as to cover the first conductive film and has light transmittance;

forming an organic electroluminescence layer on the anode electrode; and forming a cathode electrode having light transmittance on the organic electroluminescence layer.

In addition, still another aspect of the present invention provides a manufacturing method for a display apparatus, comprising steps of:

forming a switching device on a substrate;

forming a first insulating layer on the substrate on which the switching device is formed;

forming a first conductive film having light reflectivity on the first insulating layer;

forming, on the first insulating layer on which the first conductive film is formed, a second insulating layer which has a first aperture part above an electrode of the switching device and comprises a photosensitive resin having light transmittance;

etching the first insulating layer using the second insulating layer as a mask to form a second aperture part which reaches the electrode of the switching device;

forming, on the second insulating layer, an anode electrode which is electrically connected to the electrode of the switching device through the first aperture part and the second aperture part, and comprises a second conductive film having light transmittance;

forming an organic electroluminescence layer on the anode electrode; and forming a cathode electrode having light transmittance on the organic electroluminescence layer.

According to the present invention, the anode electrode comprises a first conductive film which is formed on a substrate and has light reflectivity, and a second conductive film which is formed on the first conductive film so as to cover the first conductive film and has light transmittance, whereby the light generated in the organic electroluminescence layer is taken out from the cathode electrode side, and thus a high luminous efficiency can be realized without involving degradation of the device characteristics.

In addition, according to the present invention, between the first conductive film and the second conductive film, a third conductive film which is electrically connected to each of the first conductive film and the second conductive film is partially formed, whereby the continuity between the first conductive film and the second conductive film is secured, and thus holes can be injected from the first conductive film into the organic electroluminescence layer.

In addition, according to the present invention, through the insulating layer having light transmittance, the anode electrode comprising a second conductive film having light transmittance is formed on the first conductive film which is formed on a substrate and has light reflectivity; by means of the first conductive film under the anode electrode, the light generated in the organic electroluminescence layer is taken out from the cathode electrode side; and thus a high luminous efficiency can be realized without involving degradation of the device characteristics.

BEST MODE FOR CARRYING OUT THE INVENTION

First Embodiment

Figure 1A:
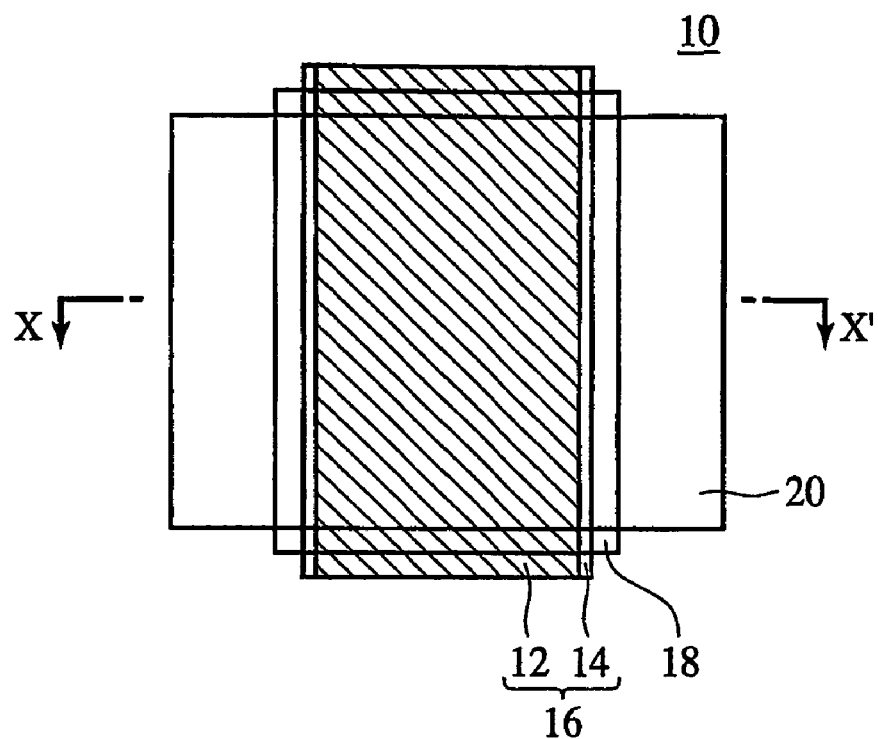
FIG. 1A and FIG. 1B are schematic drawings illustrating the structure of the display apparatus according to a first embodiment of the present invention.
Figure 1B:
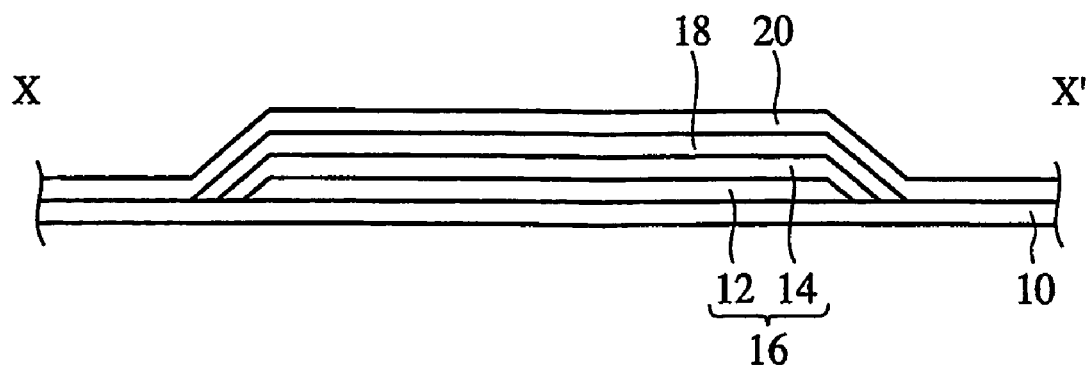
Figure 2A:
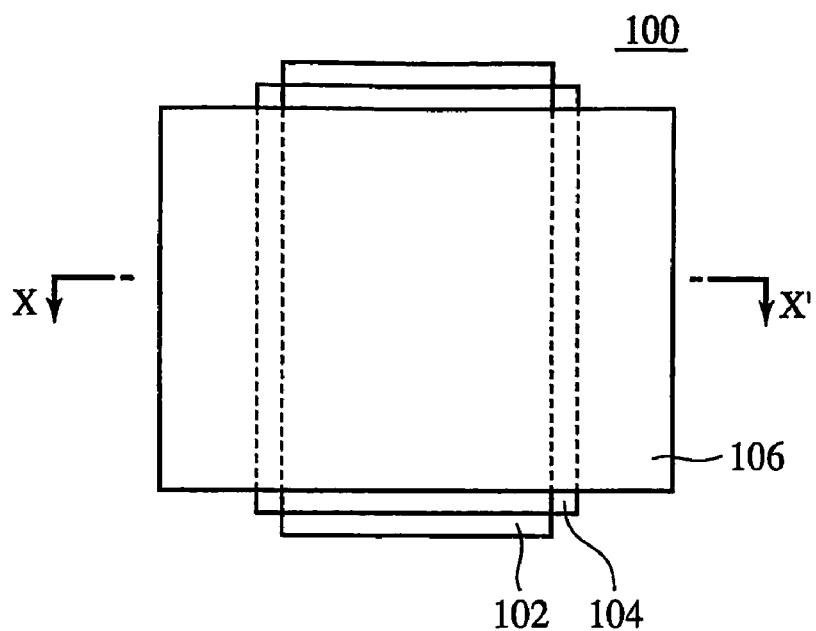
FIG. 2A and FIG. 2B are schematic drawings illustrating one example of the structure of the bottom emission type display apparatus using an organic electroluminescence device.
Figure 2B:
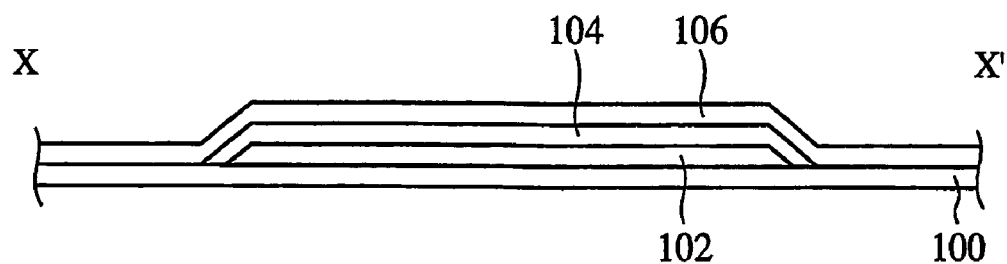

The display apparatus and the manufacturing method therefor according to a first embodiment of the present invention will be described with reference to FIG. 1A to FIG. 4C. FIG. 1A and FIG. 1B are schematic drawings illustrating the structure of the display apparatus according to the present embodiment; FIG. 2A and FIG. 2B are schematic drawings illustrating the structure of the bottom emission type display apparatus using an organic electroluminescence device; and FIG. 3A, FIG. 3B, FIG. 3C, FIG. 4A, FIG. 4B, and FIG. 4C are manufacturing step sectional views illustrating the manufacturing method for the display apparatus according to the present embodiment.

Firstly, the structure of the display apparatus according to the present embodiment will be described with reference to FIG. 1A and FIG. 1B. FIG. 1A is a top view illustrating the structure of the display apparatus according to the present embodiment, and FIG. 1B is a sectional view on the X-X' line in FIG. 1A. The display apparatus according to the present embodiment is a passive matrix type display apparatus having an organic electroluminescence device which is formed on an insulating substrate.

FIG. 1A and FIG. 1B show the structure for one pixel, however, actually a plurality of pixels are arranged in the shape of a matrix.

As shown in FIG. 1B, on an insulating substrate 10 made from a glass substrate, a light reflection film 12 made from an Al film having light reflectivity is formed. On the light reflection film 12, a transparent conductive film 14 made from an ITO film having light transmittance is formed. In the specification of the present application, the phrase "have light reflectivity" means that the light reflectance is 50% or higher, and is more preferably 80% or higher. In addition, the phrase "have light transmittance" means that the light transmittance is 50% or higher, and is more preferably 80% or higher. Thus, on the insulating substrate 10, an anode electrode 16 having the light reflection film 12 and the transparent conductive film 14 is formed. On the anode electrode 16, an organic electroluminescence layer 18 in which a hole injection layer, a hole transportation layer, a luminescence layer, an electron transportation layer, and an electron injection layer are sequentially laminated is formed. On the organic electroluminescence layer 18, a cathode electrode 20 made from and Al/ITO laminated film having light transmittance is formed. Thus, on the insulating substrate 10, an organic electroluminescence device having the anode electrode 16, the organic electroluminescence layer 18, and the cathode electrode 20 is formed.

As shown in FIG. 1A, the anode electrode 16, which is extended in a prescribed direction (the up and down direction in FIG. 1A), is formed on the insulating substrate 10. The transparent conduction film 14 is formed so as to be wider than the light reflection film 12. Thereby, the light reflection film 12 is covered by the transparent conductive film 14. The cathode electrode 20, which is extended in a direction orthogonal to the anode electrode 16 (the right and left direction in FIG. 1A), is formed on the insulating substrate 10 on which the anode electrode 16 is formed. Between these anode electrode 16 and cathode electrode 20, in the region where both the electrodes intersect each other, the organic electroluminescence layer 18 is formed in the shape of a rectangle wider than the intersection region. Thus, the pixel region where the organic electroluminescence device having the above-mentioned structure is formed is configured.

The display apparatus according to the present embodiment is characterized mainly in that, in the organic electroluminescence device, the anode electrode 16 has the light reflection film 12 having light reflectivity and the transparent conductive film 14 having light transmittance, and the light reflection film 12 is covered by the transparent conductive film 14.

In the display apparatus according to the present embodiment, electrons are injected from the cathode electrode 20 into the organic electroluminescence layer 18, and holes are injected from the transparent conductive film 14 in the anode electrode 16 into the organic electroluminescence layer 18. The injected electrons are transported to the luminescence layer by the electron transportation layer, and the injected holes are transported to the luminescence layer by the hold transportation layer. The electrons and the holes thus transported to the luminescence layer are recombined in the luminescence layer, whereby luminescence is caused. The light generated in the luminescence layer is reflected to the cathode electrode 20 side by the light reflection film 12, and is taken out from the cathode electrode 20 side having light transmittance.

In this way, the display apparatus according to the present embodiment is of top emission type, in which the existence of the light reflection film 12 allows the light to be taken out from the cathode electrode 20 side at the side opposite to the insulating substrate 10. Therefore, in the case where any other device is formed between the insulating substrate 10 and the organic electroluminescence device, light can be taken out also from the region where the any other device is formed. In other words, the luminescence area of the organic electroluminescence device will not be limited by other devices, thereby allowing a high luminous efficiency to be realized. For example, in the case where, on the insulating substrate on which a switching device, such as a thin film transistor, or the like, is formed, the organic electroluminescence device is formed through an interlayer insulating film, the luminescence area will not be limited by the switching device, thereby allowing a high luminous efficiency to be realized.

Contrarily to such a top emission type display apparatus according to the present embodiment, the display apparatus as shown in FIG. 2A and FIG. 2B is a bottom emission type display apparatus which uses the organic electroluminescence device. FIG. 2A is a top view illustrating the structure of the bottom emission type display apparatus which uses the organic electroluminescence device, and FIG. 2B is a sectional view on the X-X' line in FIG. 2A. FIG. 2A and FIG. 2B show the structure for one pixel, however, actually a plurality of pixels are arranged in the shape of a matrix.

As shown in FIG. 2A and FIG. 2B, on an insulating substrate 100 made from a glass substrate, a transparent anode electrode 102 made from an ITO film is formed. On the anode electrode 102, an organic electroluminescence layer 104 in which a hole transportation layer, a luminescence layer, and an electron transportation layer are sequentially laminated is formed. On the organic electroluminescence layer 104, a cathode electrode 106 made from an Al film, an Mg—Ag alloy film, or the like, is formed. Thus, on the insulating substrate 100, the organic electroluminescence device having the anode electrode 102, the organic electroluminescence layer 104, and the cathode electrode 106 is formed.

In the bottom emission type display apparatus as shown in FIG. 2A and FIG. 2B, the light generated in the organic electroluminescence layer 104 is taken out from the insulating substrate 100 side. Therefore, in the case where, between the insulating substrate 10 and the organic electroluminescence device, any other device, such as a switching device, or the like, is formed, the luminescence area of the organic electroluminescence device is limited by the any other device, which makes it difficult to realize a high luminous efficiency as with the display apparatus according to the present embodiment.

In addition, in the display apparatus according to the present embodiment, the light reflection film 12 made from an Al film in the anode electrode 16 is covered by the transparent conductive film 14 made from an ITO film such that any portion of the surface thereof is not left bared. Thereby, in patterning the ITO film in the manufacturing step, the light reflection film 12 made from an Al film can be prevented from being corroded. In other words, for patterning the ITO film, an alkaline developing solution is used, and thus when the surface of the Al film is exposed, and both the Al film and the ITO film are exposed to the developing solution, the battery effect may cause the Al film to be corroded. In the display apparatus according to the present embodiment, the transparent conductive film 14 made from an ITO film is formed so as to cover the light reflection 12 made from an Al film, and thus corrosion of the light reflection film 12 due to such a battery effect is prevented.

In addition, between the light reflection film 12 made from an Al film and the transparent conductive film 14 made from an ITO film, whiskers may be generated by heat, or the like, at the time of application of the driving voltage to the organic electroluminescence device. Such whiskers can be a cause for short-circuiting between the electrodes. However, in the display apparatus according to the present embodiment, the transparent conductive film 14 made from an ITO film is formed so as to cover the light reflection film 12 made from an Al film, and thus short-circuiting between the anode electrode 16 and cathode electrode 20 due to whiskers which would otherwise be generated can be prevented.

The Al film has an reflectance higher than that of the Cr film which has been conventionally used, and thus it is suitable for use as the light reflection film in the organic electroluminescence device. On the other hand, in the case where an Al film is used as the light reflection film, the above-mentioned problem is presented. In the display apparatus according to the present embodiment, an ITO film is formed so as to cover the Al film, whereby a luminous efficiency higher than that which has been conventionally obtained can be realized without problems of corrosion, short-circuiting between the electrodes, and the like.

Further, the organic electroluminescence layer 18 is formed on the transparent conductive film 14 made from an ITO film, as in the conventional organic electroluminescence device. Therefore, as the organic electroluminescence layer 18, the organic electroluminescence layer of the same material and structure as those of the organic electroluminescence layer in the conventional organic electroluminescence device can be used as it is, for constituting a top emission type display apparatus having a high luminous efficiency.

Next, the manufacturing method for the display apparatus according to the present embodiment will be described with reference to FIG. 3A, FIG. 3B, FIG. 3C, FIG. 4A, FIG. 4B, and FIG. 4C.

Figure 3A:
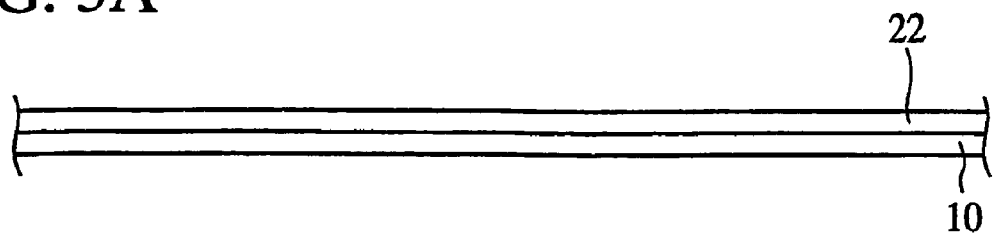
FIG. 3A, FIG. 3B, and FIG. 3C are manufacturing step sectional views (first set of two) illustrating the manufacturing method for the display apparatus according to the first embodiment of the present invention.

Firstly, on the insulating substrate 10 made from a glass substrate, an Al film 22 with a film thickness of, for example, 150 nm is formed by, for example, the sputtering method (see FIG. 3A).

Then, by photolithography and etching, the Al film 22 is patterned to a prescribed geometry. Thus, on the insulating substrate 10, the light reflection film 12 made from the Al film 22 is formed (see FIG. 3B).

Figure 3B:
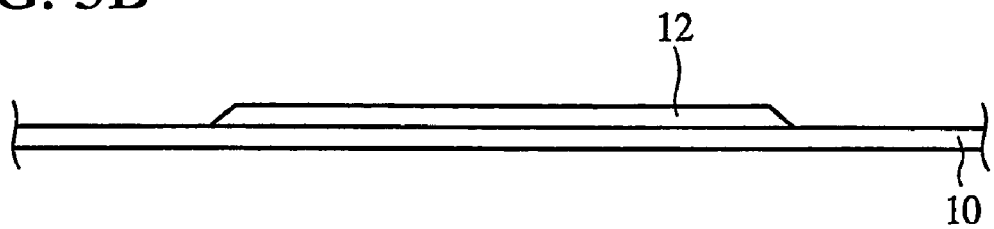
Figure 3C:
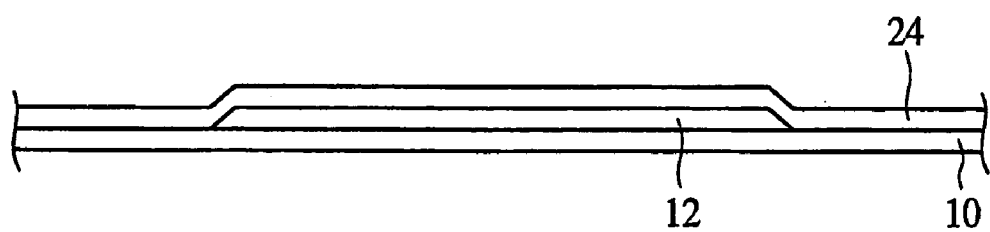

Then, on the insulating substrate 10 on which the light reflection film 12 is formed, an ITO film 24 with a film thickness of 70 nm, for example, is formed by, for example, the sputtering method (see FIG. 3C).

Then, by photolithography and etching, the ITO film 24 is patterned to a prescribed geometry. At this time, the ITO film 24 is patterned to a geometry and size covering the light reflection film 12, such that any portion of the surface of the light reflection film 12 is not left bared. Thus, the transparent conductive film 14 made from the ITO film 24 is formed (see FIG. 4A). While the ITO film 24 is patterned, the surface of the light reflection film 12 made from the Al film 22 under the ITO film 24 will not be exposed, and thus corrosion of the light reflection film 12 due to the battery effect can be prevented.

Then, on the insulating substrate 10 on which the anode electrode 16 having the light reflection film 12 and the transparent conductive film 14 is formed, a 2-TNATA (4,4',4"-tris (2-naphthylphenylamino)triphenyl amine) film with a film thickness of, for example, 40 nm; an α-NPD(N,N'-dinaphthyl-N,N'-diphenyl-[1,1'-biphenyl]-4,4'-diamine) film with a film thickness of, for example, 10 nm; and Alq$_3$ (tris(8-hydroxyquinolinate)aluminum) film with a film thickness of 30 nm, for example, doped with, for example, a small amount of t(npa)py (1,3,6,8-tetra(N-naphthyl-N'-phenylamino) pyrene); and Alq$_3$ film with a film thickness of, for example, 20 nm; and an LiF film with a film thickness of, for example, 0.5 nm are sequentially formed by the vacuum deposition method, for example, through a vapor deposition mask which has apertures of a prescribed size.

Figure 4A:
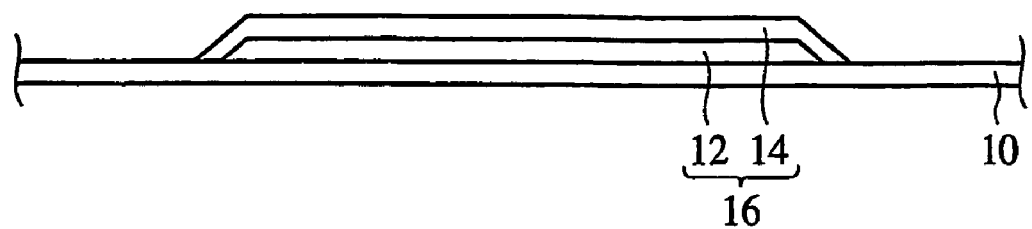
FIG. 4A, FIG. 4B, and FIG. 4C are manufacturing step sectional views (second set of two) illustrating the manufacturing method for the display apparatus according to the first embodiment of the present invention.
Figure 4B:
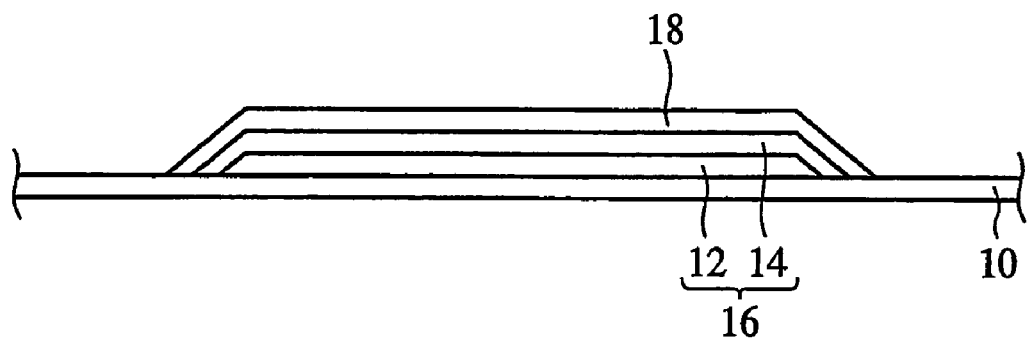

Thus, the organic electroluminescence layer 18 having the hole injection layer made from a 2-TNATA film; the hole transportation layer made from an α-NPD film; the luminescence layer made from an Alq$_3$ film doped with t(npa)py; the electron transportation layer made from an Alq$_3$ film; and the electron injection made from an LiF film is formed (see FIG. 4B).

Then, on the insulating substrate 10 on which the organic electroluminescence layer 18 is formed, an Al film with a film thickness of, for example, 10 nm and an ITO film with a film thickness of, for example, 30 nm are sequentially formed by the vacuum deposition method and the sputtering method, for example, through a mask which has apertures of a prescribed geometry, to form an Al/ITO laminated film.

Figure 4C:
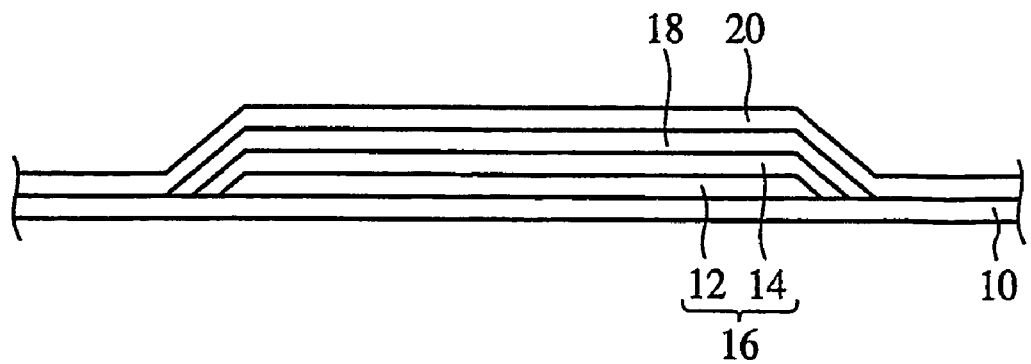

Thus, the cathode electrode 20 made from the Al/ITO laminated film is formed (see FIG. 4C).

Thus, the display apparatus as shown in FIG. 1A and FIG. 1B is manufactured.

In this way, according to the present embodiment, in the display apparatus in which the organic electroluminescence device is used, the anode electrode 16 has the light reflection film 12 having light reflectivity, and the transparent conductive film 14 having light transmittance, and thus a top emission type display apparatus having a high luminous efficiency can be realized.

In addition, the light reflection film 12 is covered by the transparent conductive film 14, and thus degradation of the device characteristics due to corrosion of the light reflection film 12 and whiskers which would otherwise be generated between the light reflection film 12 and the transparent conductive film 14 can be suppressed.

In addition, the organic electroluminescence layer 18 is formed on the transparent conductive film 14 as in the conventional organic electroluminescence device, and thus as the organic electroluminescence layer 18, the organic electroluminescence layer of the same material and structure as those of the organic electroluminescence layer in the conventional organic electroluminescence device can be used as it is.

Second Embodiment

Figure 5A:
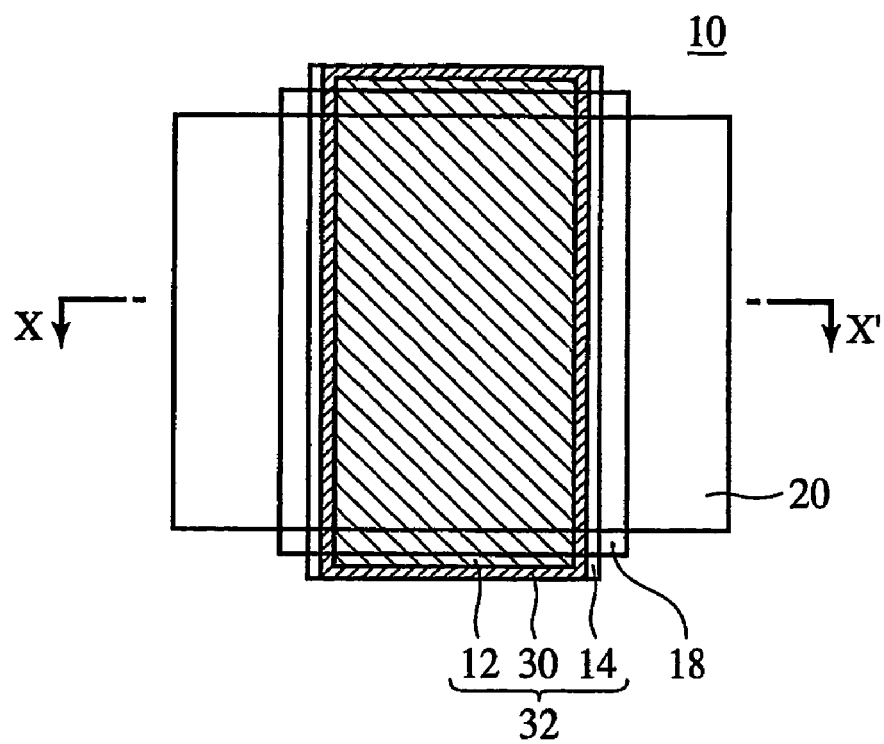
FIG. 5A and FIG. 5B are schematic drawings illustrating the structure of the display apparatus according to a second embodiment of the present invention.
Figure 5B:
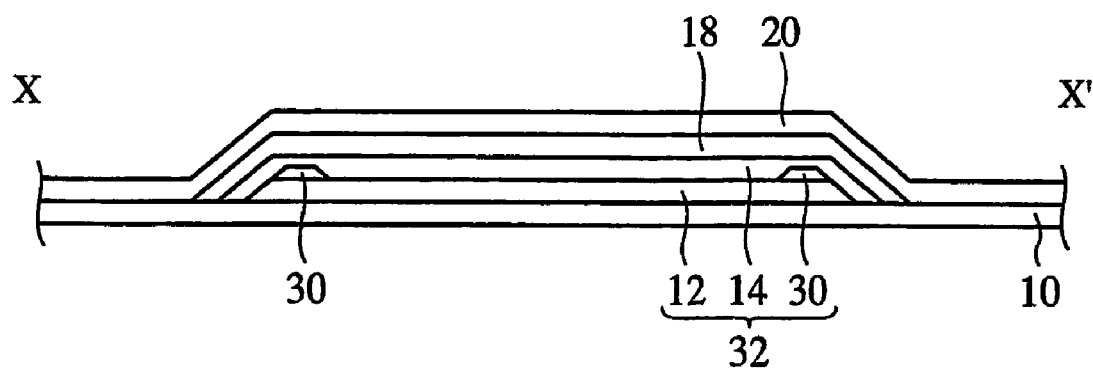

The display apparatus and the manufacturing method thereof according to a second embodiment of the present invention will be described with reference to FIG. 5A to FIG. 7C. FIG. 5A and FIG. 5B are schematic drawings illustrating the structure of the display apparatus according to the present embodiment; and FIG. 6A, FIG. 6B, FIG. 6C, FIG. 6D, FIG. 7A, FIG. 7B, and FIG. 7C are manufacturing step sectional views illustrating the manufacturing method for the display apparatus according to the present embodiment. For the same components as those of the display apparatus and the manufacturing method therefor according to the first embodiment as shown in FIG. 1A, FIG. 1B, FIG. 3A, FIG. 3B, FIG. 3C, FIG. 4A, FIG. 4B, and FIG. 4C, the same signs are provided, and explanation is omitted or simplified.

As with the display apparatus according to the first embodiment, the display apparatus according to the present embodiment is a passive matrix type display apparatus having an organic electroluminescence device formed on the insulating substrate, and the basic configuration thereof is the same as that of the display apparatus according to the first embodiment. The display apparatus according to the present embodiment is different from the display apparatus according to the first embodiment in that the continuity between the light reflection film 12 and the transparent conductive film 14 is secured, and holes can be injected from the light reflection film 12.

Firstly, the structure of the display apparatus according to the present embodiment will be described with reference to FIG. 5A and FIG. 5B. FIG. 5A is a top view illustrating the structure of the display apparatus according to the present embodiment, and FIG. 5B is a sectional view on the X-X' line in FIG. 5A. FIG. 5A and FIG. 5B show the structure for one pixel, however, actually a plurality of pixels are arranged in the shape of a matrix.

As shown in FIG. 5B, on an insulating substrate 10 made from a glass substrate, a light reflection film 12 made from an Al film having light reflectivity is formed. On the peripheral edge portion of the light reflection film 12, an intervening film 30 made from an Mo (molybdenum) film having light reflectivity is formed. On the light reflection film 12 on the peripheral edge portion of which the intervening film 30 is formed, a transparent conduction film 14 made from an ITO film having light transmittance is formed. The intervening film 30 is electrically connected to each of the light reflection film 12 and the transparent conductive film 14, and with this intervening film 30, the electrical connection between the transparent conductive film 14 and the light reflection film 12 is improved, resulting in the continuity between both being secured. Thus, on the insulating substrate 10, and anode electrode 32 having the light reflection film 12, the transparent conductive film 14, and the intervening film 30 for improving the electrical connection between both is formed. On the anode electrode 32, an organic electroluminescence layer 18 in which a hole injection layer, a hole transportation layer, a luminescence layer, an electron transportation layer, and an electron injection layer are sequentially laminated is formed. On the organic electroluminescence layer 18, a cathode electrode 20 made from an Al/ITO laminated film having light transmittance is formed. Thus, on the insulating substrate 10, the organic electroluminescence device having the anode electrode 32, the organic electroluminescence layer 18 and the cathode electrode 20 is formed.

As shown in FIG. 5A, the anode electrode 32, which is extended in a prescribed direction (the up and down direction in FIG. 5A), is formed on the insulating substrate 10. The intervening film 30 is formed in the shape of a frame on the peripheral edge portion of the light reflection film 12. The transparent conductive film 14 is formed so as to be wider than the light reflection film 12 on which the intervening film 30 is formed. Thereby, the light reflection film 12 on which the intervening film 30 is formed is covered by the transparent conductive film 14. The cathode electrode 20, which is extended in a direction orthogonal to the anode electrode 16 (the right and left direction in FIG. 5A), is formed on the insulating substrate 10 on which the anode electrode 16 is formed. Between these anode electrode 32 and cathode electrode 20, in the region where both the electrodes intersect each other, the organic electroluminescence layer 18 is formed in the shape of a rectangle wider than the intersection region. Thus, the pixel region where the organic electroluminescence device having the above-mentioned structure is formed is configured.

The display apparatus according to the present embodiment is characterized mainly in that, in the organic electroluminescence device, the anode electrode 32 has the light reflection film 12 having light reflectivity; the intervening film 30 which is formed on the peripheral edge portion of the light reflection film 12, and is electrically connected to each of the light reflection film 12 and the transparent conductive film 14 which is formed on the light reflection film 12, for securing the continuity between both; and the transparent conductive film 14 having light transmittance that is formed on the light reflection film 12 on the peripheral edge portion of which the intervening film 30 is formed, and the light reflection film 12 is covered by the transparent conductive film 14.

The Al film and the ITO film have no good electrical connection therebetween, and thus in the display apparatus according to the first embodiment, a sufficient continuity may not be secured between the light reflection film 12 made from an Al film and the transparent conductive film 14 made from an ITO film in the anode electrode 16.

In the display apparatus according to the present embodiment, the peripheral edge portion of the anode electrode 32 has an Al/Mo/ITO structure. Therefore, the intervening film 30 made from an Mo film that is electrically connected to each of the Al film and the ITO film improves the electrical connection between the light reflection film 12 made from an Al film and the transparent conductive film 14 made from an ITO film, to secure the continuity between both. Therefore, holes can be injected from the light reflection film 12 into the organic electroluminescence layer 18. In addition, the intervening film 30 is formed on the peripheral edge portion of the light reflection film 12, and thus owing to the light reflection film 12, which is higher in reflectance than the intervening film 30, the light which has been generated in the luminescence layer in the organic electroluminescence layer 18 can be sufficiently reflected to the cathode electrode 20 side.

In addition, the transparent conductive film 14 is formed so as to cover the light reflection film 12 on the peripheral edge portion of which the intervening film 30 is formed, and thus as in the display apparatus according to the first embodiment, corrosion of the light reflection film 12 can be prevented. In addition, a short-circuit between the anode electrode 32 and the cathode electrode 20 due to whiskers which would otherwise be generated between the light reflection film 12 and the transparent conductive film 14 by heat, or the like, at the time of application of the diving voltage can be prevented. In addition, as the organic electroluminescence layer 18, the organic electroluminescence layer in the conventional organic electroluminescence device can be used as it is.

Next, the manufacturing method for the display apparatus according to the present embodiment will be described with reference to FIG. 6A, FIG. 6B, FIG. 6C, FIG. 6D, FIG. 7A, FIG. 7B, and FIG. 7C.

Firstly, on the insulating substrate 10 made from a glass substrate, an Al film 22 with a film thickness of, for example, 150 nm is formed by, for example, the sputtering method.

Figure 6A:
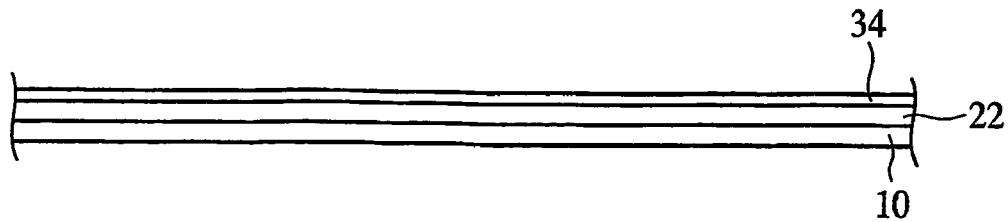
FIG. 6A, FIG. 6B, FIG. 6C, and FIG. 6D are manufacturing step sectional views (first set of two) illustrating the manufacturing method for the display apparatus according to the second embodiment of the present invention.
Figure 6B:
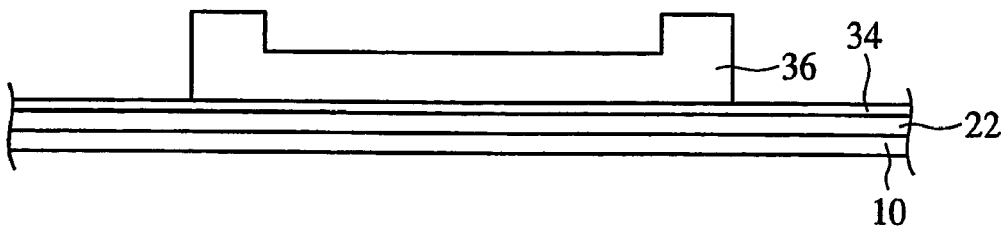

Then, on the Al film 22, an Mo film 34 with a film thickness of, for example, 10 nm is formed by, for example the sputtering method (see FIG. 6A).

Then, on the Mo film 34, a resist film 36 is formed by, for example, the spin coating method. Thereafter, by using photolithography for patterning the resist film 36, a portion of the resist film 36 is left so as to cover the region where a portion of the Al film 22 is to be left for formation of the light reflection film 12. At this time, the resist film 36 is left such that the film thickness of the peripheral edge portion of the resist film 36 which covers the region where a portion of the Mo film 34 is to be left for formation of the intervening film 30 is thicker, while the film thickness of the portion other than the peripheral edge portion of the resist film 36 that covers the region where the Mo film 34 is to be removed and the Al film 22 is to be left is thinner (see FIG. 6B).

The setting of the film thickness of the above-mentioned resist film 36 at a thicker or thinner value can be performed by adjusting the amount of exposure by means of, for example, a mask for use in photolithography. Specifically, for example, the portion of the mask for use in photolithography that exposes the portion of the resist film 36 that covers the region where the Mo film 34 is to be left for formation of the intervening film 30 is provided with ordinary apertures, while the portion of the mask that exposes the portion of the resist film 36 that covers the region where the Mo film 34 is to be removed and the Al film 22 is to be left is provided with slit-like apertures. When such a mask is used to expose the resist film 36, the exposure of the portion of the resist film 36 that covers the region where the Mo film 34 is to be removed and the Al film 22 is to be left is rendered insufficient, as compared to that of the portion of the resist film 36 that covers the region for later formation of the intervening film 30. In this way, by exposing the resist film 36 with the amount of exposure thereof being partially varied, and developing it, the film thickness of the resist film 36 can be varied.

Figure 6C:
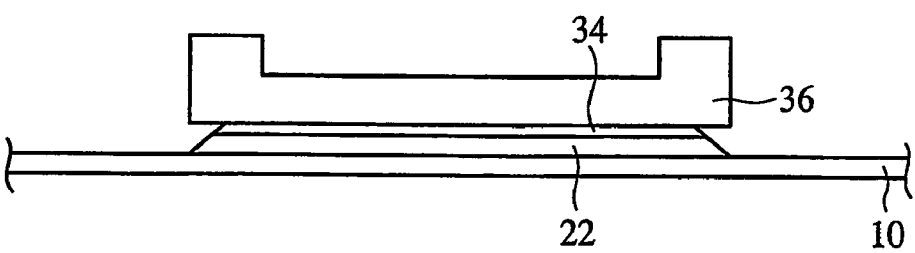
Figure 6D:
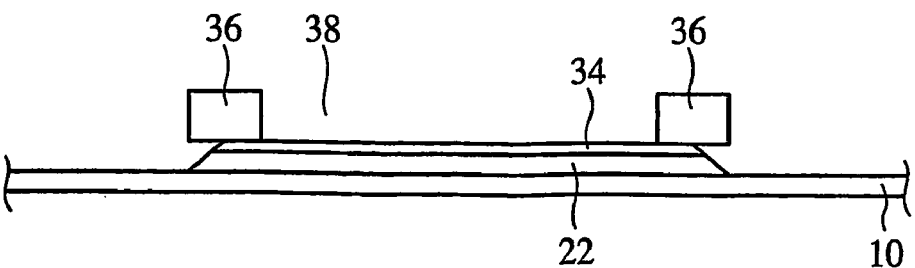

Then, by using the resist film 36 the film thickness of which has been varied as a mask, and by, for example, wet etching, the unnecessary Al film 22 and Mo film 34 which are outside the region for later formation of the anode electrode 32 are removed (see FIG. 6C). For wet etching, and etching solution produced by mixing, for example, phosphoric acid, nitric acid, acetic acid, and water can be used.

Then, by carrying out the ashing treatment, for example, the resist film 36 is etched back to remove the portion thinner in film thickness of the resist film 36 that covers the region where the Mo film 34 is to be removed and the Al film 22 is to be left, for formation of an aperture part 38 in the resist film 36. On the other hand, the portion thicker in film thickness of the resist film 36 that covers the region for later formation of the intervening film 30 is left (see FIG. 6D).

Then, by using the resist film 36 in which the aperture part 38 has been formed as a mask, and by, for example, wet etching, the Mo film 34 which has been exposed at the bottom in the aperture part 38 is removed. For wet etching, an etching solution produced by mixing, for example, phosphoric acid, nitric acid, acetic acid, and water can be used as in the case where the unnecessary Mo film 34 and Al film 22 have been removed in FIG. 6C.

Then, the resist film 36 which has been used as the mask is removed.

Figure 7A:
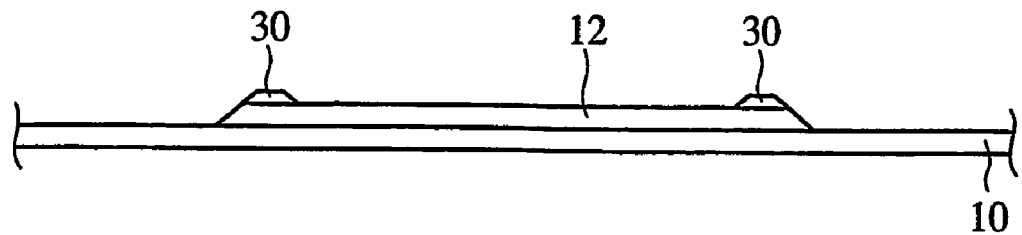
FIG. 7A, FIG. 7B, and FIG. 7C are manufacturing step sectional views (second set of two) illustrating the manufacturing method for the display apparatus according to the second embodiment of the present invention.

Thus, the light reflection film 12 made from the Al film 22, and the intervening film 30 made from the Mo film 34 which has been formed on the peripheral edge portion of the light reflection film 12 is formed (see FIG. 7A).

Figure 7B:
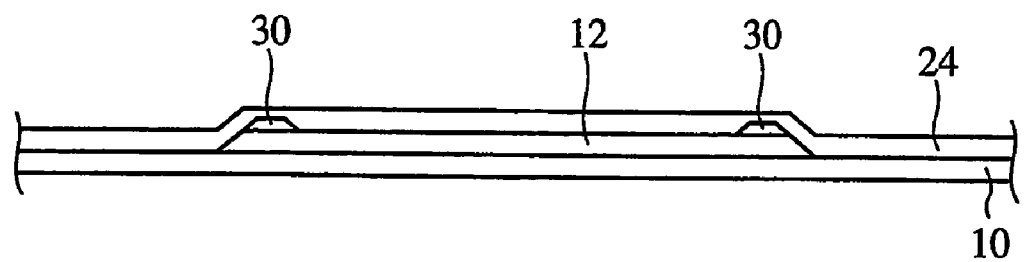
Figure 7C:
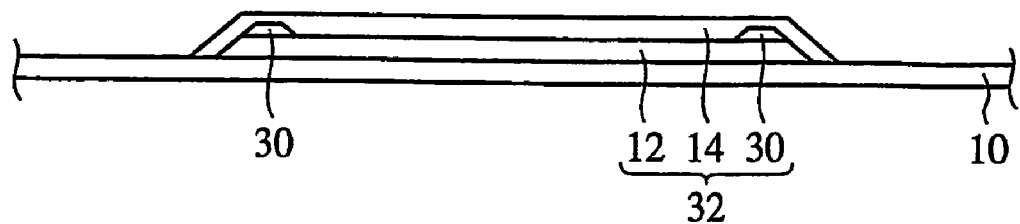

Then, on the insulating substrate 10 on which the light reflection film 12 and the intervening film 30 are formed, an ITO film 24 with a film thickness of, for example, 70 nm is formed by, for example, the sputtering method (see FIG. 7B).

Then, by photolithography and etching, the ITO film 24 is patterned to a prescribed geometry. At this time, the ITO film 24 is patterned to a geometry and size covering the light reflection film 12, such that any portion of the surface of the light reflection film 12 on the peripherred edge portion of which the intervening film 30 is formed is not left bared. Thus, the transparent conductive film 14 made from the ITO film 24 is formed (see FIG. 7C).

Thereafter, by forming the organic electroluminescence layer 18 and the cathode electrode 20, respectively, by the same steps as those in the manufacturing method for the display apparatus according to the first embodiment as shown in FIG. 4B and FIG. 4C, the display apparatus according to the present embodiment as shown in FIG. 5A and FIG. 5B is manufactured.

In this way, according to the present embodiment, in the display apparatus in which the organic electroluminescence device is used, the anode electrode 32 has the light reflection film 12 having light reflectivity, and the transparent conductive film 14 having light transmittance, and thus a top emission type display apparatus having a high luminous efficiency can be realized.

In addition, the light reflection film 12 is covered by the transparent conductive film 14, and thus degradation of the device characteristics due to corrosion of the light reflection film 12 and whiskers which would otherwise be generated between the light reflection film 12 and the transparent conductive film 14 can be suppressed.

Further, on the peripheral edge portion of the light reflection film 12, the intervening film 30 which is electrically connected to each of the light reflection film 12 and the transparent conductive film 14 which is formed on the light reflection film 12 is formed for securing the continuity between both, and thus holes can be injected from the light reflection film 12 into the organic electroluminescence layer 18.

In addition, the organic electroluminescence layer 18 is formed on the transparent conductive film 14 as in the conventional organic electroluminescence device, and thus as the organic electroluminescence layer 18, the organic electroluminescence layer of the same material and structure as those of the organic electroluminescence layer in the conventional organic electroluminescence device can be used as it is.

Third Embodiment

Figure 8A:
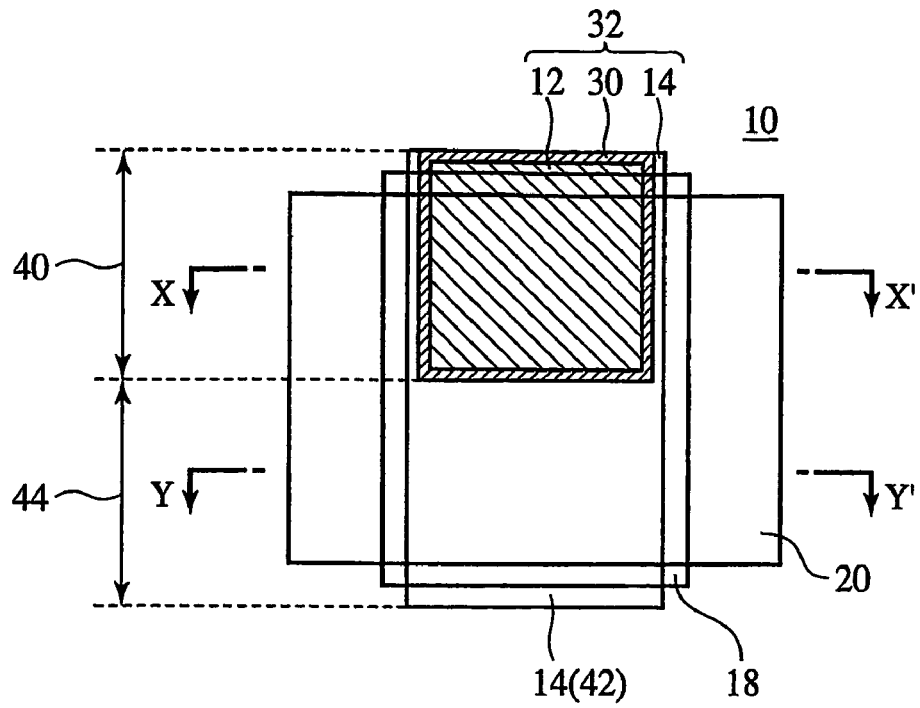
FIG. 8A, FIG. 8B, and FIG. 8C are schematic drawings illustrating the structure of the display apparatus according to a third embodiment of the present invention.
Figure 8B:
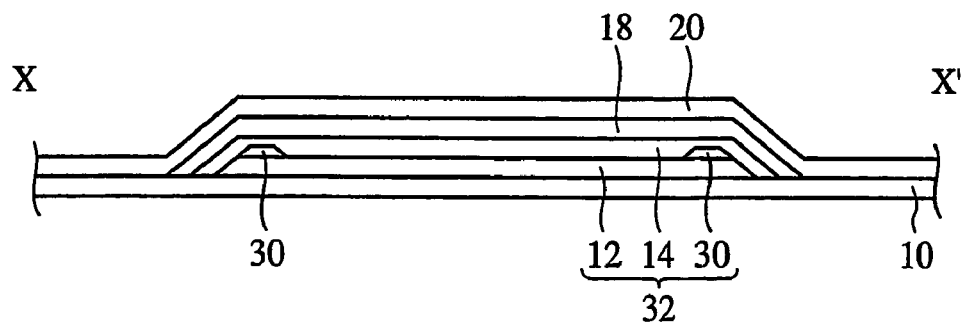
Figure 8C:
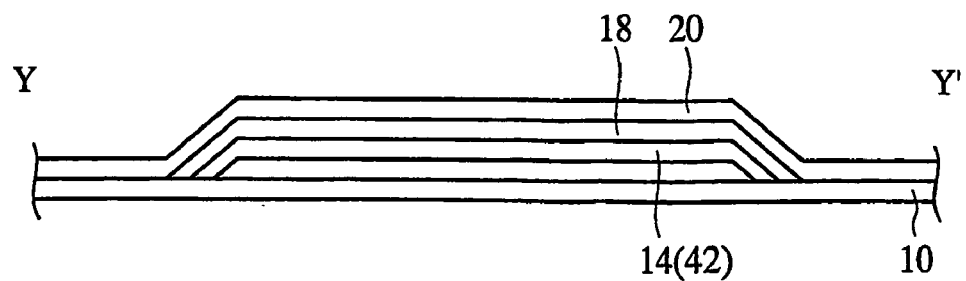

The display apparatus and the manufacturing method therefor according to a third embodiment of the present invention will be described with reference to FIG. 8A, FIG. 8B, and FIG. 8C. FIG. 8A, FIG. 8B, and FIG. 8C are schematic drawings illustrating the structure of the display apparatus according to the present embodiment. For the same components as those of the display apparatus according to the first and second embodiments as shown in FIG. 1A and FIG. 1B; and FIG. 5A and FIG. 5B, respectively, the same signs are provided, and explanation is omitted or simplified.

The display apparatus according to the present embodiment is a passive matrix type display apparatus which, in one pixel in which the organic electroluminescence device formed on the insulation substrate is formed, has a top emission part where the light generated in the luminescence layer in the organic electroluminescence layer is taken out from the cathode electrode side which is opposite to the insulating substrate, and a double-side emission part where the light generated in the luminescence layer in the organic electroluminescence layer is taken out from both sides, i.e., the cathode electrode side and the insulating substrate side.

Hereinbelow, the structure of the display apparatus according to the present embodiment will be described with reference to FIG. 8A, FIG. 8B, and FIG. 8C. FIG. 8A is a top view illustrating the structure of the display apparatus according to the present embodiment; FIG. 8B is a sectional view on the X-X' line in FIG. 8A, and FIG. 8C is a sectional view on the Y-Y' line in FIG. 8A. FIG. 8A, FIG. 8B, and FIG. 8C show the structure for one pixel, however, actually a plurality of pixels are arranged in the shape of a matrix.

As shown in FIG. 8A, on an insulating substrate 10 made from a glass substrate, a transparent conductive film 14, an organic electroluminescence layer 18, and a cathode electrode 20 are formed as in the display apparatuses according to the first and second embodiments. The pixel region where the transparent conductive film 14 and the cathode electrode 20 intersect with each other is divided into two regions subsequently equal in area by the boundary orthogonal to the direction in which the transparent conductive film 14 extends. In the region on one side of the boundary, a top emission part 40 in which a light reflection film 12 is formed under the transparent conductive film 14, and an anode electrode 32 having the light reflection film 12 and the transparent conductive film 14 is formed is provided. In the region on the other side of the boundary, a double-side emission part 44 in which the light reflection film 12 is not formed, and an anode electrode 42 made from the transparent conductive film 14 is formed is provided.

The top emission part 40 has a sectional structure as shown in FIG. 8B. The sectional structure as shown in FIG. 8B has the same sectional structure as that of the display apparatus according to the second embodiment. In other words, on the insulating substrate 10, the light reflection film 12 made from an Al film having light reflectivity is formed. On the peripheral edge portion of the light reflection film 12, an intervening film 30 made from an Mo film having light reflectivity is formed. On the light reflection film 12 on the peripheral edge portion of which the intervening film 30 is formed, the transparent conductive film 14 made from an ITO film having light transmittance is formed. The intervening film 30 is electrically connected to each of the light reflection film 12 and the transparent conductive film 14, and with this intervening film 30, the electrical connection between the transparent conductive film 14 and the light reflection film 12 is improved, resulting in the continuity between both being secured. Thus, on the insulating substrate 10, the anode electrode 32 which has the light reflection film 12, the transparent conductive film 14, and the intervening film 30 for improving the electrical connection between both is formed. On the anode electrode 32, an organic electroluminescence layer 18 in which a hole injection layer, a hole transportation layer, a luminescence layer, an electron transportation layer, and an electron injection layer are sequentially laminated is formed. On the organic electroluminescence layer 18, a cathode electrode 20 made form an Al/ITO laminated film having light transmittance is formed. Thus, on the insulating substrate 10 in the top emission part 40, the organic electroluminescence device having the anode electrode 32 which has the light reflection film 12, the organic electroluminescence layer 18, and the cathode electrode 20 is formed. In the top emission part 40, the light generated in the organic electroluminescence layer 18 is reflected to the cathode electrode 20 side by the light reflection film 12, and is taken out from the cathode electrode 20 side having light transmittance.

The double-side emission part 44 has a sectional structure as shown in FIG. 8C. In other words, on the insulating substrate 10, the anode electrode 42 made from the transparent conductive film 14 which is shared with the top emission part 40 is formed. Unlike the top emission part 40, in the double-side emission part 44, the light reflection film 12 is not formed, and on the insulating substrate 10, the transparent conductive film 14 is directly formed. On the anode electrode 42, the organic electroluminescence layer 18 which is shared with the top emission part 40 is formed. On the organic electroluminescence layer 18, the cathode electrode 20 having light transmittance that is shared with the top emission part 40 is formed. Thus, on the insulating substrate 10 in the double-side emission part 44, the organic electroluminescence device having the anode electrode 42, the organic electroluminescence layer 18, and the cathode electrode 20 is formed. In the double-side emission part 44, the light reflection film 12 is not formed, and the light generated in the organic electroluminescence layer 18 is taken out from both sides, i.e., the cathode electrode 20 side and the insulating substrate 10 side.

In this way, by providing the region where the light reflection film 12 is formed and the region where the light reflection film 12 is not formed, in the same pixel, in other words, by partially forming the light reflection film 12 in the luminescence region where the transparent conductive film 14 which is hared by the anode electrodes 32 and 42, and the cathode electrode 20 overlap each other, the top emission type region and the double-side emission type region may be provided in the same pixel.

In the present embodiment, the top emission part 40 and the double-side emission part 44 are provided with substantially the same geometry, however, the geometry of each of the emission parts 40 and 44 is not limited to this. By adequately changing the geometry of the light reflection film 12 which is partially formed in the same pixel, the geometry of each of the emission parts 40 and 44 may have a desired geometry. Thereby, depending upon the application, the function, or the like, for the display apparatus, the luminescence characteristics, such as brightness, can be set at desired ones.

In addition, in the present embodiment, the same anode electrode 32 as that in the display apparatus according to the second embodiment has been used in the top emission part 40, however, the same anode electrode 16 as that in the display apparatus according to the first embodiment, in which the intervening film 30 is not formed, may be used in the top emission part 40.

In addition, in the present embodiment, the light reflection film 12 is partially formed in the same pixel, however, for a plurality of pixels arranged in the shape of a matrix, pixels in which the light reflection film 12 is formed, and pixels in which the light reflection film 12 is not formed may be separately provided for causing the top emission type pixels and the double-sided emission type pixels to coexist.

Fourth Embodiment

Figure 9:
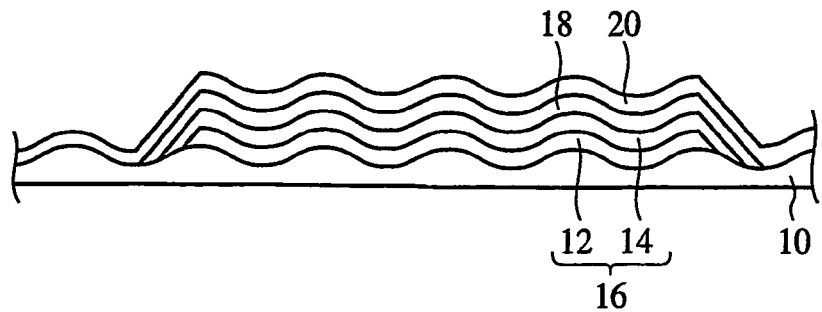
FIG. 9 is a sectional view illustrating the structure of the display apparatus according to a fourth embodiment of the present invention.

The display apparatus and the manufacturing method therefor according to a fourth embodiment of the present invention will be described with reference to FIG. 9. FIG. 9 is a sectional drawing illustrating the structure of the display apparatus according to the present embodiment. For the same components as those of the display apparatus and the manufacturing method therefor according to the first embodiment as shown in FIG. 1A and FIG. 1B; FIG. 3A, FIG. 3B, and FIG. 3C; and FIG. 4A, FIG. 4B, and FIG. 4C, the same signs are provided, and explanation is omitted or simplified.

The display apparatus according to the present embodiment is characterized mainly in that, in the display apparatus according to the first embodiment, smooth irregularities are formed on the surface of the insulating substrate 10.

In other words, as shown in FIG. 9, smooth irregularities are formed on the surface of an insulating substrate 10 made from a glass substrate. On the insulating substrate 10 on the surface of which smooth irregularities are formed, an anode electrode 16 having a light reflection film 12 and a transparent conductive film 15, an organic electroluminescence layer 18, and a cathode electrode 20 are formed as in the display apparatus according to the first embodiment.

In the display apparatus according to the present embodiment, owing to the smooth irregularities formed on the surface of the insulating substrate 10, the areas of the anode electrode 16, the organic electroluminescence layer 18, and the cathode electrode 20 which are formed on the insulating substrate 10 are larger, as compared to the case where these are formed on the insulating substrate 10 with a flat surface on which irregularities are not formed. Thereby, the luminous efficiency can be further improved.

As the method for forming irregularities on the surface of the insulating substrate 10, the method as described below can be used.

For example, by using a solution of sulfuric acid or the like, for etching the surface of the insulating substrate 10, irregularities can be directly formed on the surface of the insulating substrate 10.

Alternatively, after coating the insulating substrate 10 with a resin, or the like, the light exposure method is used for forming a prescribed pattern made from the resin, or the like, on the insulating substrate 10, whereby irregularities based on whether the resin, or the like, is given or not may be formed on the surface of the insulating substrate 10.

After forming smooth irregularities on the surface of the insulating substrate 10 by using the technique as mentioned above, the display apparatus according to the present embodiment can be manufactured by the same steps as those in the manufacturing method for the display apparatus according to the first embodiment as shown in FIG. 3A to FIG. 3C, and FIG. 4A to FIG. 4C.

In this way, according to the present embodiment, smooth irregularities are formed on the surface of the insulating substrate 10 on which the organic electroluminescence device is formed, which can further improve the luminous efficiency.

The present embodiment has been explained with respect to the case where, in the display apparatus according to the first embodiment, smooth irregularities are formed on the surface of the insulating substrate 10, however, also for the display apparatuses according to the second and third embodiments, smooth irregularities may be formed on the surface of the insulating substrate 10 in the same manner as described above for further improving the luminous efficiency.

Fifth Embodiment

Figure 10:
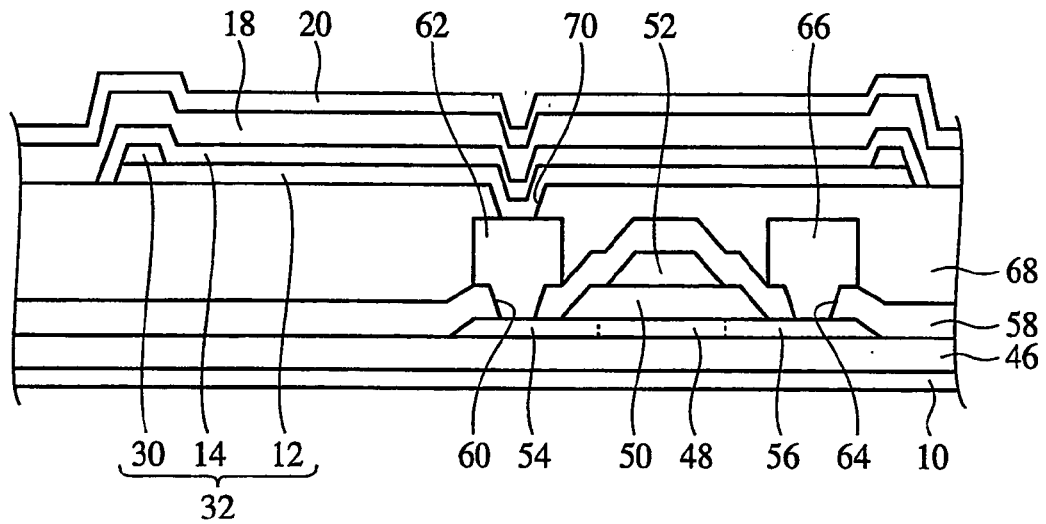
FIG. 10 is a sectional view illustrating the structure of the display apparatus according to a fifth embodiment of the present invention.
Figure 11:
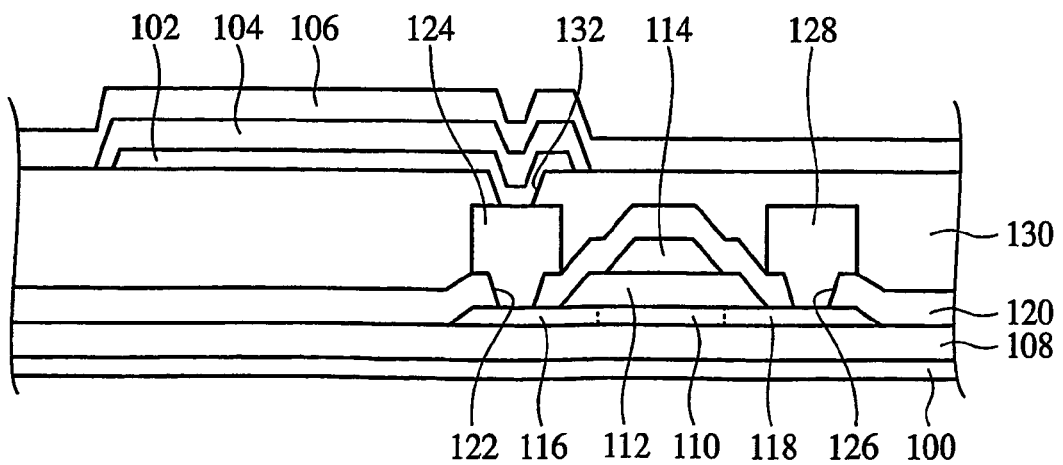
FIG. 11 is a sectional view illustrating one example of the structure of the bottom emission type display apparatus using an organic electroluminescence device, and a thin film transistor as a switching device.

The display apparatus and the manufacturing method therefor according to a fifth embodiment of the present invention will be described with reference to FIG. 10 to FIG. 13C. FIG. 10 is a sectional view illustrating the structure of the display apparatus according to the present embodiment; FIG. 11 is a sectional view illustrating one example of the structure of the bottom emission type display apparatus which uses a thin film transistors as a switching device together with the organic electroluminescence device; and FIG. 12A, FIG. 12B, and FIG. 12C; and FIG. 13A, FIG. 13B, and FIG. 13C are manufacturing step sectional views illustrating the manufacturing method for the display apparatus according to the present embodiment. For the same components as those of the display apparatus and the manufacturing method therefor according to the second embodiment as shown in FIG. 5A to FIG. 7C, the same signs are provided, and explanation is omitted or simplified.

The display apparatus according to the present embodiment is provided with a thin film transistor as a switching device together with the same organic electroluminescence device as that in the display apparatus according to the second embodiment, and is an active matrix type display apparatus which, with this thin film transistor, controls the driving voltage to be applied to the organic electroluminescence device. Hereinbelow, the structure of the display apparatus according to the present embodiment will be described with reference to FIG. 10. FIG. 10 shows the structure for one pixel, however, actually a plurality of pixels are arranged in the shape of a matrix.

On an insulating substrate 10 made from a glass substrate, a buffer layer 46 made from a silicon oxide film is formed. On the buffer layer 46, a channel layer 48 made from a polysilicon film is formed. On the channel layer 48, a gate electrode 52 is formed through a gate insulating film 50 made from a silicon oxide film. In the channel layer 48 on both sides of the gate electrode 52, a source region 54 and a drain region 56 are formed, respectively. Thus, on the insulating substrate 10, a thin film transistor which has the gate electrode 52, and the source region 54 and the drain region 56 which are formed in the channel layer 48, for controlling the driving voltage to be applied to the organic electroluminescence device, is formed.

On the insulating substrate 10 on which the thin film transistor is formed, an interlayer insulating film 58 is formed. On the interlayer insulating film 58, a source electrode 62 which is connected to the source region 54 through a contact hole 60, and a drain electrode 66 which is connected to the drain region 56 through a contact hole 64 are formed, respectively.

On the interlayer insulating film 58 on which the source electrode 62 and the drain electrode 66 are formed, an interlayer insulating film 68 is formed. In the interlayer insulating film 68, a contact hole 70 which reaches the source electrode 62 is formed.

On the interlayer insulating film 68 in which the contact hole 70 is formed, a light reflection film 12 made from an Al film having light reflectivity is formed in the region including the contact hole 70. On the peripheral edge portion of the light reflection film 12, an intervening film 30 made from a Mo film having light reflectivity is formed. On the light reflection film 12 on the peripheral edge portion of which the intervening film 30 is formed, a transparent conductive film 14 made from an ITO film having light transmittance is formed. The intervening film 30 is electrically connected to each of the light reflection film 12 and the transparent conductive film 14, and with this intervening film 30, the electrical connection between the transparent conductive film 14 and the light reflection film 12 is improved, resulting in the continuity between both being secured. Thus, on the interlayer insulating film 68, the anode electrode 32 having the light reflection film 12, the transparent conductive film 14, and the intervening film 30 for securing the continuity between both is formed. The anode electrode 32 is electrically connected to the source electrode 62 of the thin film transistor through the contact hole 70 which is formed in the interlayer insulating film 68.

On the anode electrode 32, an organic electroluminescence layer 18 in which a hole injection layer, a hole transportation layer, a luminescence layer, an electron transportation layer, and an electron injection layer are sequentially laminated is formed. On the organic electroluminescence device having the anode electrode 32, the organic electroluminescence layer 18, and the cathode electrode 20 is formed.

The display apparatus according to the present embodiment is of top emission type, in which the existence of the light reflection film 12 allows the light to be taken out from the cathode electrode 20 side at the side opposite to the insulating substrate 10. Therefore, the thin film transistor formed above the insulating substrate 10 will not limit the luminescence area, thereby allowing a high luminous efficiency to be realized.

Contrarily to such a top emission type display apparatus according to the present embodiment, the display apparatus as shown in FIG. 11 is a bottom emission type display apparatus which uses a thin film transistor as a switching device together with an organic electroluminescence device. FIG. 11 shows the structure for one pixel, however, actually a plurality of pixels are arranged in the shape of a matrix.

As shown in FIG. 11, on an insulating substrate 100 made from a glass substrate, a buffer layer 108 is formed. On the buffer layer 108, a channel layer 110 is formed. On the channel layer 110, a gate electrode 114 is formed through a gate insulating film 112. In the channel layer 110 on both sides of the gate electrode 114, a source region 116 and a drain region 118 are formed, respectively. Thus, on the insulating substrate 100, a thin film transistor having the gate electrode 114, and the source region 116 and the drain region 118 which are formed in the channel layer 110 is formed.

On the insulating substrate 100 on which the thin film transistor is formed, an interlayer insulating film 120 is formed. On the interlayer insulating film 120, a source electrode 124 which is connected to the source region 116 through a contact hole 122, and a drain electrode 128 which is connected to the drain region 118 through a contact hole 126 are formed, respectively.

On the interlayer insulating film 120 on which the source electrode 124 and the drain electrode 128 are formed, an interlayer insulating film 130 is formed. In the interlayer insulating film 130, a contact hole 132 which reaches the source electrode 124 is formed.

On the interlayer insulating film 130 in which the contact hole 132 is formed, the organic electroluminescence device having a transparent anode electrode 102 made from an ITO film, an organic electroluminescence layer 104, and a cathode electrode 106 made from an Al film, an Mg—Ag alloy film, or the like, is formed in the region including the contact hole 132. The anode electrode 102 is electrically connected to the source electrode 124 of the thin film transistor through the contact hole 132 which is formed in the interlayer insulating film 130.

In the bottom emission type display apparatus as shown in FIG. 11, the light generated in the organic electroluminescence layer 104 is taken out from the insulating substrate 100 side. Therefore, the thin film transistor formed between the insulating substrate 10 and the organic electroluminescence device limits the luminescence area of the organic electroluminescence device, and thus it is difficult to realize a high luminous efficiency as with the display apparatus according to the present embodiment.

In addition, the display apparatus according to the present embodiment has the anode electrode 32 of the same structure as that in the display apparatus according to the second embodiment, and thus with the intervening film 30, the electrical connection between the light reflection film 12 made from an Al film and the transparent conductive film 14 made from an ITO film is improved, resulting in the continuity between both being secured. Thereby, holes can be injected from the light reflection film 12 which is electrically connected to the source electrode 62 of the thin film transistor, into the organic electroluminescence layer 18. In addition, the transparent conductive film 14 is formed so as to cover the light reflection film 12 on the peripheral edge portion of which the intervening film 30 is formed, and thus corrosion of the light reflection film 12 can be prevented. In addition, a short-circuit between the anode electrode 32 and the cathode electrode 20 due to whiskers which would otherwise be generated between the light reflection film 12 and the transparent conductive film 14 by heat, or the like, at the time of application of the diving voltage can be prevented. In addition, as the organic electroluminescence layer 18, the organic electroluminescence layer of the same material and structure as those of the organic electroluminescence layer in the conventional organic electroluminescence device can be used as it is.

Next, the manufacturing method for the display apparatus according to the present embodiment will be described with reference to FIG. 12A, FIG. 12B, and FIG. 12C; and FIG. 13A, FIG. 13B, and FIG. 13C.

Firstly, on the insulating substrate 10 made from a glass substrate, the buffer layer 46 made from a silicon oxide film with a film thickness of, for example, 300 nm is formed by, for example, the CVD method.

Then, on the buffer layer 46, a polysilicon film with a film thickness of, for example, 40 nm is formed by, for example, the CVD method. In place of the polysilicon film, an amorphous silicon film may be formed, and by the laser anneal method, or the like, the amorphous silicon film may be crystallized to produce a polysilicon film.

Figure 12A:
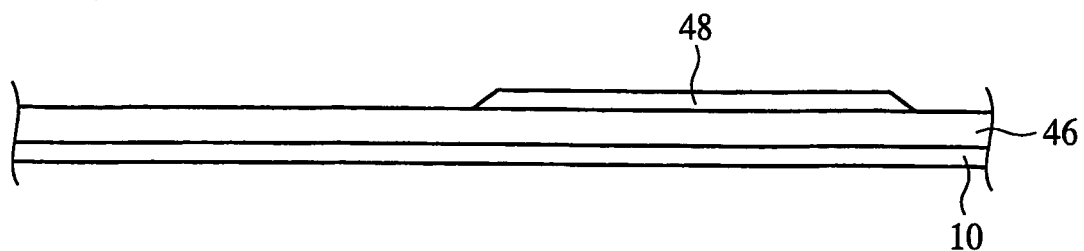
FIG. 12A, FIG. 12B, and FIG. 12C are manufacturing step sectional views (first set of two) illustrating the manufacturing method for the display apparatus according to the fifth embodiment of the present invention.
Figure 13A:
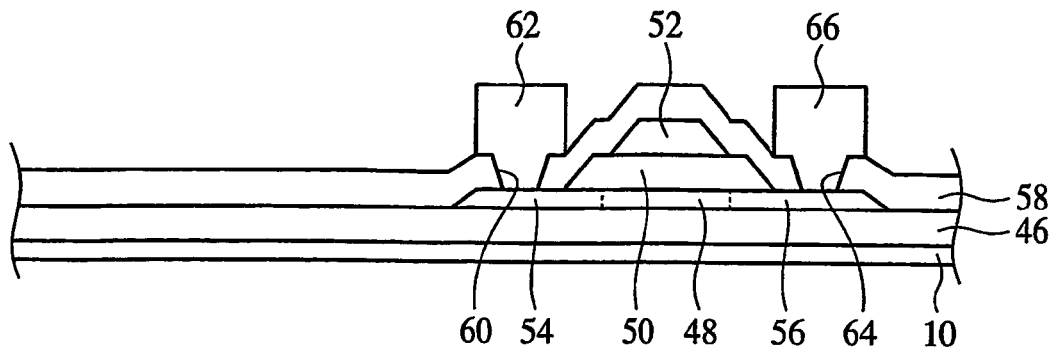
FIG. 13A, FIG. 13B, and FIG. 13C are manufacturing step sectional views (second set of two) illustrating the manufacturing method for the display apparatus according to the fifth embodiment of the present invention.
Figure 13B:
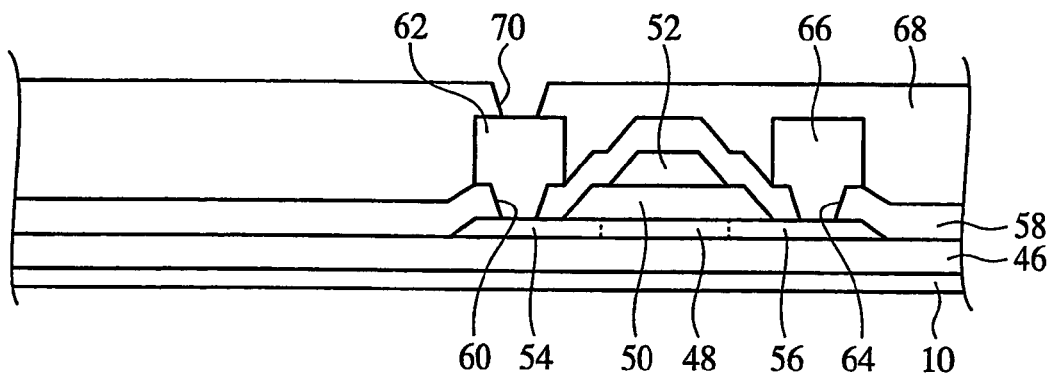
Figure 13C:
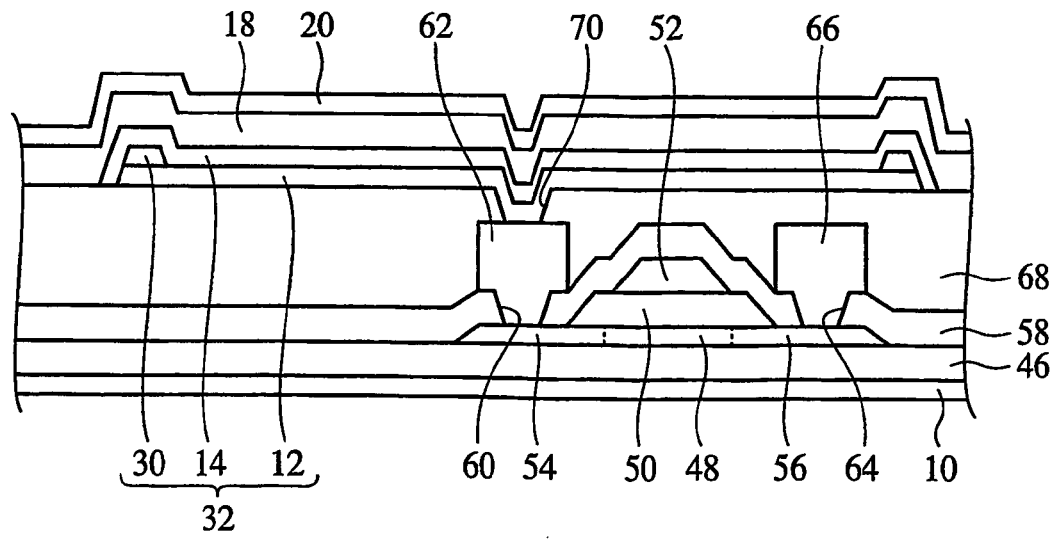

Then, by photolithography and dry etching, the polysilicon film is patterned for formation of the channel layer 48 made from a polysilicon film (see FIG. 12A).

Then, on the buffer layer 46 on which the channel layer 48 is formed, a silicon oxide film with a film thickness of, for example, 100 nm is formed by, for example, the CVD method.

Then, by, for example, the sputtering method, an AlNd (aluminum-neodymium alloy) film with a film thickness of, for example, 300 nm is formed.

Then, by photolithography and dry etching, the silicon oxide film and the AlNd film are patterned for formation of the gate insulating film 50 made from a silicon oxide film and the gate electrode 52 made from an AlNd film on the channel layer 48.

Then, using the gate electrode 52 as a mask, and by the ion injection method, for example, phosphorous ions are ion-injected for formation of the source region 54 and the drain region 56 in the channel layer 48 on both sides of the gate electrode 52, respectively.

Figure 12B:
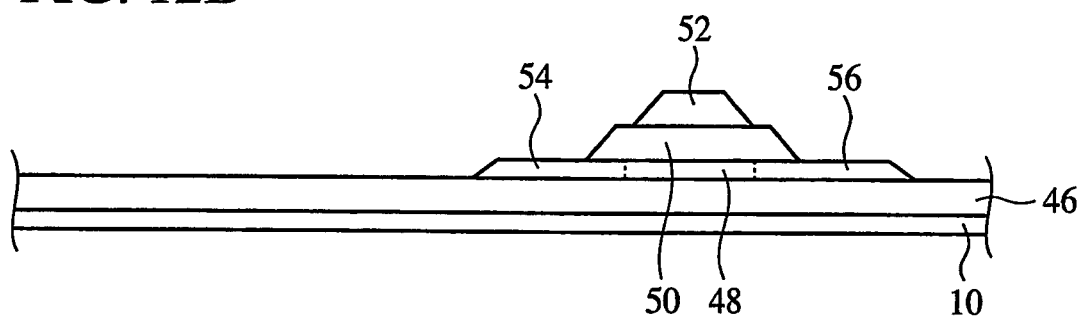

Thus, on the insulating substrate 10, the thin film transistor having the gate electrode 52, and the source region 54 and the drain region 56 which are formed in the channel layer 48 is formed (see FIG. 12B).

Then, on the insulating substrate 10 on which the thin film transistor is formed, the interlayer insulating film 58 made from a silicon nitride film with a film thickness of, for example, 300 nm is formed by, for example, the CVD method.

Figure 12C:
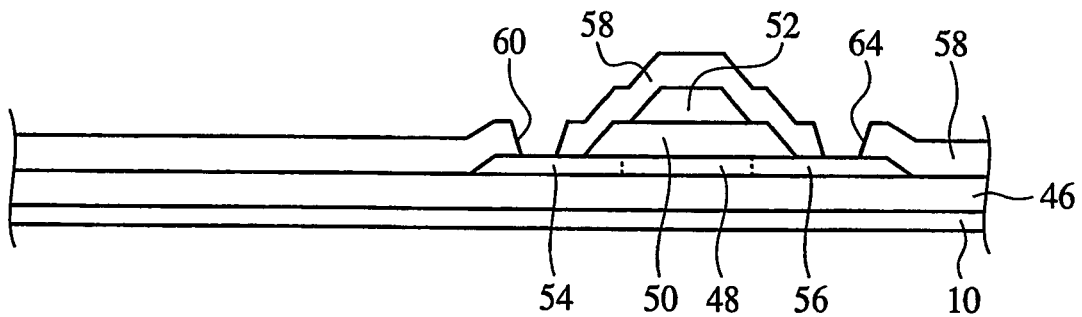

Then, by photolithography and dry etching, the contact hole 60 which reaches the source region 54 and the contact hole 64 which reaches the drain region 56 are formed in the interlayer insulating film 58, respectively (see FIG. 12C).

Then, by, for example, the sputtering method, a Ti (titanium)/Al/Ti film with a film thickness of, for example, 100 nm/100 nm/100 nm is formed on the interlayer insulating film 58 in which the contact holes 60 and 64 are formed.

Then, by photolithography and dry etching, the Ti/Al/Ti film is patterned for formation of the source electrode 62 and the drain electrode 66 made from a Ti/Al/Ti film, respectively (see FIG. 13A).

Then, by, for example, the CVD method, the interlayer insulating film 68 made from a photosensitive resin with a film thickness of, for example, 3.0 μm if formed on the interlayer insulating film 58 on which the source electrode 62 and the drain electrode 66 are formed.

Then, by lithography, the contact hole 70 which reaches the source electrode 62 is formed in the interlayer insulating film 68 (see FIG. 13B).

Then, on the interlayer insulating film 68 in which the contact hole 70 is formed, the anode electrode 32 which is connected to the source electrode 62 through the contact hole 70, the organic electroluminescence layer 18, and the cathode electrode 20 are formed by the same steps as those in the manufacturing method for the display apparatus according to the second embodiment (see FIG. 13C).

Thus, the display apparatus according to the present embodiment as shown in FIG. 10 is manufactured.

In this way, according to the present embodiment, in the active matrix type display apparatus in which the organic electroluminescence device is used, the anode electrode 32 has the light reflection film 12 having light reflectivity, and the transparent conductive film 14 having light transmittance, and thus a top emission type display apparatus having a high luminous efficiency can be realized, without undergoing any limitation by the thin film transistor formed under the organic electroluminescence device.

In addition, the light reflection film 12 is covered by the transparent conductive film 14, and thus degradation of the device characteristics due to corrosion of the light reflection film 12 and whiskers which would otherwise be generated between the light reflection film 12 and the transparent conductive film 14 can be suppressed.

Further, on the peripheral edge portion of the light reflection film 12, the intervening film 30 which is electrically connected to each of the light reflection film 12 and the transparent conductive film 14 which is formed on the light reflection film 12 is formed for securing the continuity between both, and thus holes can be injected from the light reflection film 12 which is electrically connected to the source electrode 62 of the thin film transistor, into the organic electroluminescence layer 18.

In addition, the organic electroluminescence layer 18 is formed on the transparent conductive film 14 as in the conventional organic electroluminescence device, and thus as the organic electroluminescence layer 18, the organic electroluminescence layer of the same material and structure as those of the organic electroluminescence layer in the conventional organic electroluminescence device can be used as it is.

In the present embodiment, on the interlayer insulating film 68, the same organic electroluminescence device as that in the display apparatus according to the second embodiment is formed, however, the same organic electroluminescence device as that in the display apparatus according to the first or the third embodiment may be formed. In the case where, as in the display apparatus according to the first embodiment, the intervening film 30 is not formed between the light reflection film 12 and the transparent conductive film 14, it is preferable that, by not embedding the light reflection film 12 into the contact hole 70 which reaches the source electrode 62, or the like, the transparent conductive film 14 is directly connected to the source electrode 62.

In addition, as in the display apparatus according to the fourth embodiment in which smooth irregularities are formed on the surface of the insulating substrate 10, smooth irregularities may be formed on the surface of the interlayer insulating film 68 for formation of the organic electroluminescence device on the interlayer insulating film 68 on which the smooth irregularities are formed.

Sixth Embodiment

Figure 14:
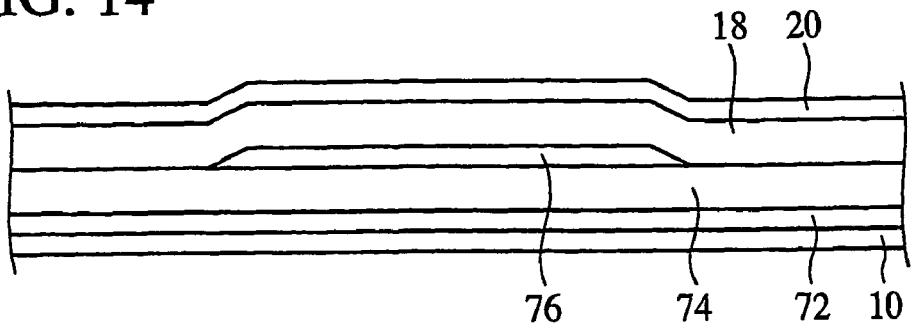
FIG. 14 is a sectional view illustrating the structure of the display apparatus according to a sixth embodiment of the present invention.
Figure 15:
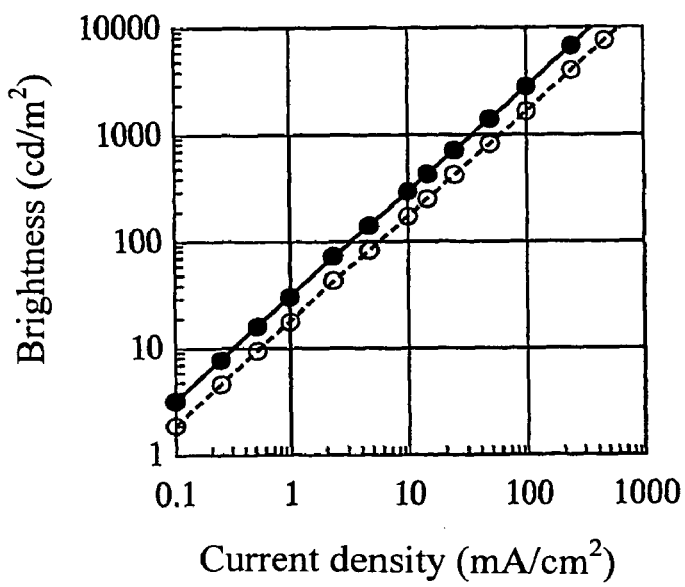
FIG. 15 is a graph depicting the characteristic of the display apparatus according to the sixth embodiment of the present invention.
Figure 16:
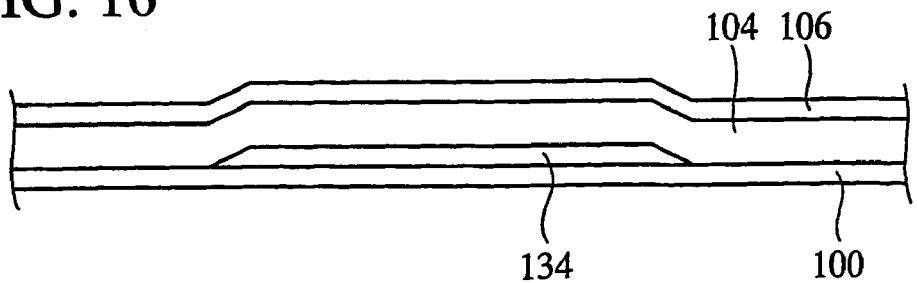
FIG. 16 is a sectional view illustrating the structure of the display apparatus which uses a Cr film as the anode electrode.
Figure 17A:
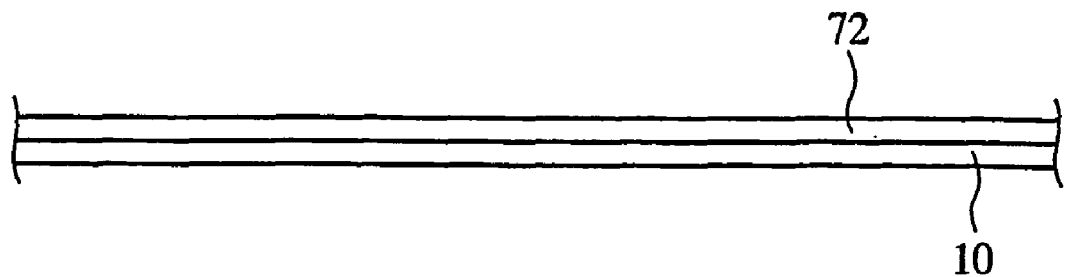
FIG. 17A, FIG. 17B, and FIG. 17C are manufacturing step sectional views (first set of two) illustrating the manufacturing method for the display apparatus according to the sixth embodiment of the present invention.
Figure 17B:
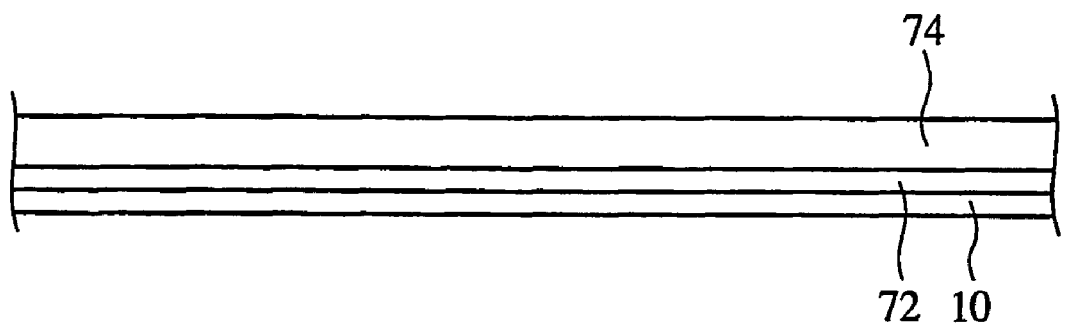

The display apparatus and the manufacturing method therefor according to a sixth embodiment of the present invention will be described with reference to FIG. 14 to FIG. 18C. FIG. 14 is a sectional view illustrating the structure of the display apparatus according to the present embodiment; FIG. 15 is a graph depicting the characteristic of the display apparatus according to the present embodiment; FIG. 16 is a sectional view illustrating the structure of the display apparatus which uses a Cr film as the anode electrode; and FIG. 17A, FIG. 17B, and FIG. 17C; and FIG. 18A, FIG. 18B, and FIG. 18C are manufacturing step sectional views illustrating the manufacturing method for the display apparatus according to the present embodiment. For the same components as those in the display apparatus and the manufacturing method therefor according to the first embodiment as shown in FIG. 1A and FIG. 1B; FIG. 3A, FIG. 3B, and FIG. 3C; and FIG. 4A, FIG. 4B, and FIG. 4C, the same signs are provided, and explanation is omitted or simplified.

As in the display apparatus according to the first embodiment, the display apparatus according to the present embodiment is a passive matrix type display apparatus having an organic electroluminescence device formed on the insulating substrate, and the basic configuration thereof is the same as that of the display apparatus according to the first embodiment. The display apparatus according to the present embodiment is different from the display apparatus according to the first embodiment in that, on the light reflection film, an anode electrode made from a transparent conductive film is formed through the insulating layer having light transmittance.

Firstly, the structure of the display apparatus according to the present embodiment will be described with reference to FIG. 14. FIG. 14 shows the structure for one pixel, however, actually a plurality of pixels are arranged in the shape of a matrix.

As shown in FIG. 14, on an insulating substrate 10 made from a glass substrate, a light reflection film 72 made from an Al film having light reflectivity is formed. A light reflection film 72 which has a prescribed geometry may be formed for each pixel or a light reflection film 72 may be formed over the entire surface in the display region where the pixels are arranged. On the light reflection film 72, an insulating layer 74 made from a photosensitive resin having light transmittance is formed. As the photosensitive resin, which is the material for the insulating layer 74, an acryl resin, for example, is used. The insulating layer 74 is formed so as to cover the light reflection film 72, so as not to leave any portion of the surface of the light reflection film 72 bared.

On the insulating layer 74, an anode electrode 76 made from a transparent conductive film of ITO having light transmittance is formed. On the anode electrode 76, an organic electroluminescence layer 18 in which a hole injection layer, a hole transportation layer, a luminescence layer, an electron transportation layer, and an electron injection layer are sequentially laminated is formed. On the organic electroluminescence layer 18, a cathode electrode 20 in which an Al film formed with a thin film thickness and having light transmittance, an Ag film formed with a thin film thickness and having light transmittance, a transparent conductive film made from an ITO film having light transmittance, a transparent conductive film made from an ITO film having light transmittance are sequentially laminated is formed. Thus, on the insulating substrate 10, the organic electroluminescence device having the anode electrode 76, the organic electroluminescence layer 18, and the cathode electrode 20 is formed through the light reflection film 72 and the insulating layer 74.

In the display apparatus according to the present embodiment, electrons are injected from the cathode electrode 20 into the organic electroluminescence layer 18, and holes are injected from the anode electrode 76 into the organic electroluminescence layer 18. The injected electrons are transported to the luminescence layer by the electron transportation layer, and the injected holes are transported to the luminescence layer by the hole transportation layer. The electrons and holes thus transported to the luminescence layer are recombined in the luminescence layer, whereby luminescence is caused. The light generated in the luminescence layer is emitted to the anode electrode 76 side and the cathode electrode 20 side. The light emitted to the anode electrode 76 side is reflected to the cathode electrode 20 side by the light reflection film 72 through the insulating layer 74 having light transmittance, and is taken out from the cathode electrode 20 side having light transmittance through the insulating layer 74, the anode electrode 76, and the organic electroluminescence layer 18. The light emitted to the cathode electrode 20 side is taken out from the cathode electrode 20 side having light transmittance as it is. Thus, the light generated in the luminescence layer is taken out from the cathode electrode 20 side having light transmittance.

In this way, the display apparatus according to the present embodiment is of top emission type, in which the existence of the light reflection film 72 which is formed under the anode electrode 76 made from a transparent conductive film through the insulating layer 74 allows the light to be taken out from the cathode electrode 20 side at the side opposite to the insulating substrate 10. Therefore, as in the display apparatus according to the first embodiment, in the case where any other device is formed between the insulating substrate 10 and the organic electroluminescence device, light can be taken out also from the region where the any other device is formed. In other words, the luminescence are of the organic electroluminescence device will not be limited by other devices, thereby allowing a high luminous efficiency to be realized.

In addition, in the case where, under the light reflection film 72, any other device is formed, the light reflection film 72 may be formed so as to be wider than the luminescence region where the anode electrode 76 and the cathode electrode 20 overlap each other. By thus forming the light reflection film 72 so as to be wider, it can be suppressed that the luminescence of the organic electroluminescence device affects the characteristics of other devices.

The film thickness of the insulating layer 74 having light transmittance that is formed between the anode electrode 76 and the light reflection film 72 is preferably set at a value of 1 μm or more. This is because, if the film thickness of the insulating layer 74 is set at a value of less than 1 μm, there is a possibility that a light reduction due to the effect of interference of light is caused in the insulating layer 74, and thus a sufficient luminous efficiency cannot be obtained.

FIG. 15 is a graph for the display apparatus according to the present embodiment and a display apparatus using an anode electrode made from a Cr film as shown in FIG. 16 that depicts the results obtained by changing the current density of the current injected into the organic electroluminescence layer and measuring the brightness to compare the characteristics of both the display apparatuses. The abscissa in the graph as shown in FIG. 15 represents the current density of the current injected into the organic electroluminescence layer, and the ordinate the brightness measured of the display apparatus. In addition, in the graph as shown in FIG. 15, the plot as given with black dots indicates the result of measurement for the display apparatus according to the present embodiment, while the plot as given with white dots indicates the result of measurement for the display apparatus using the anode electrode made from a Cr film as shown in FIG. 16.

In the display apparatus according to the present embodiment, an Al film with a film thickness of 100 nm was used as the light reflection film 72; and acryl resin layer with a film thickness of 3.0 μm was used as the insulating layer 74; and an ITO film with a film thickness of 70 nm was used as the anode electrode 76. In addition, as the organic electroluminescence layer 18, that in which a hole injection layer made from a 2-TNATA film with a film thickness of 140 nm; a hole transportation layer made from an α-NPD film with a film thickness of 10 nm; a luminescence layer made from an $Alq_3$ film with a film thickness of 30 nm that is doped with a small amount of t(npa)py; and electron transportation layer made from an Alq$_3$ film with a film thickness of 20 nm; and an electron injection layer made from an LiF film with a film thickness of 0.5 nm are sequentially laminated was used. In addition, as the cathode electrode 20, that in which an Al film with a film thickness of 1.5 nm; an Ag film with a film thickness of 15 nm; and an ITO film with a film thickness of 35 nm are sequentially laminated was used.

The display apparatus as shown in FIG. 16 that was compared with the display apparatus according to the present embodiment about the characteristic is a top emission type display apparatus which uses a Cr film as the anode electrode. As shown in the figure, on the insulating substrate 100 made from a glass substrate, an anode electrode 134 made from a Cr film is formed. On the anode electrode 134, an organic electroluminescence layer 104 is formed. On the organic electroluminescence layer 104, a cathode electrode 106 is formed. Except that, on the insulating substrate 100, the anode electrode 134 is directly formed, and that a Cr film is used as the anode electrode 134, the materials and structures of the organic electroluminescence layer 104 and the cathode electrode 106 were the same as those of the organic electroluminescence layer and the cathode electrode in the display apparatus according to the present embodiment which was compared about the characteristic.

As can be seen from the graph as shown in FIG. 15, at the same current injection density, the display apparatus according to the present embodiment gave a brightness approximately twice as high as that obtained with the display apparatus which uses a Cr film as the anode electrode 134 as shown in FIG. 16. Therefore, according to the display apparatus according to the present embodiment in which the light reflection film 72 is formed under the anode electrode 76 made from a transparent conductive film through the insulating layer 74 having light transmittance, it can be said that the luminous efficiency can be effectively improved, as compared to that in the case where a Cr film is merely used as the anode electrode.

In addition, as in the display apparatus according to the first embodiment, in the display apparatus according to the present embodiment, the organic electroluminescence layer 18 is formed on the anode electrode 76 made from a transparent conductive film as in the convention organic electroluminescence device. Therefore, as the organic electroluminescence layer 18, the organic electroluminescence layer of the same material and structure as those of the organic electroluminescence layer in the conventional organic electroluminescence device can be used as it is to constitute a top emission type display apparatus having a high luminous efficiency.

In addition, in the display apparatus according to the present embodiment, the insulating layer 74 intervenes between the anode electrode 76 made from a transparent conductive film and the light reflection film 72 made from an Al film, and the light reflection film 72 is covered by the insulating layer 74 such that any portion of the surface thereof is not left bared. Therefore, as in the display apparatus according to the first embodiment, corrosion of the light reflection film 72 made from an Al film due to the battery effect in patterning the ITO film in the manufacturing step can be prevented.

Further, between the light reflection film 72 made from an Al film and the anode electrode 76 made from a transparent conductive film the insulating layer 74 is formed. Therefore, unlike the case where the anode electrode in which the ITO film is directly formed on the Al film is used, whiskers which may cause a short-circuit between the electrodes will not be generated by heat, or the like, at the time of application of the driving voltage to the organic electroluminescence device.

Next, the manufacturing method for the display apparatus according to the present embodiment will be described with reference to FIG. 17A, FIG. 17B, and FIG. 17C; and FIG. 18A, FIG. 18B, and FIG. 18C.

Firstly, on the insulating substrate 10 made from a glass substrate, an Al film with a film thickness of, for example, 150 nm is formed by, for example, the sputtering method. As required, by photolithography and etching, the Al film may be patterned for each pixel to a prescribed geometry. Or, the Al film may be left over the entire surface of the insulating substrate 10 that becomes the display region where the pixels are arranged. Thus, on the insulating substrate 10, the light reflection film 72 made from an Al film is formed (see FIG. 17A).

Then, the light reflection film 72 is coated with, for example, an acryl photosensitive resin by, for example, the spin coating method. Then, the applied photosensitive resin is exposed using a prescribed mask, followed by developing the exposed photosensitive resin with the use of a prescribed developing solution. Thus, the insulating layer 74 made from a photosensitive resin with a film thickness of, for example, 3.0 μm is formed by photolithography (see FIG. 17B). Herein, the insulating layer 74 is formed so as to cover the light reflection film 72, so as not to leave any portion of the surface of the light reflection film 72 bared.

In the present embodiment, the insulating layer 74 is formed with a photosensitive resin, and thus the insulating layer 74 having a surface with a high flatness can be obtained, and on the highly flat surface, the organic electroluminescence device can be formed.

Figure 17C:
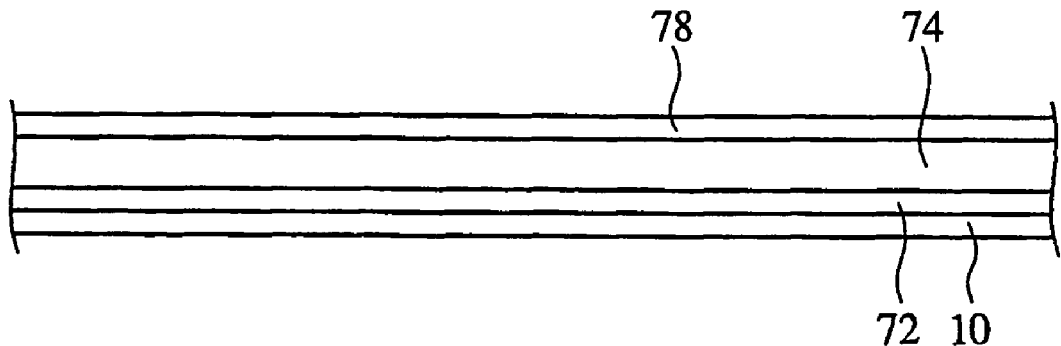
Figure 18A:
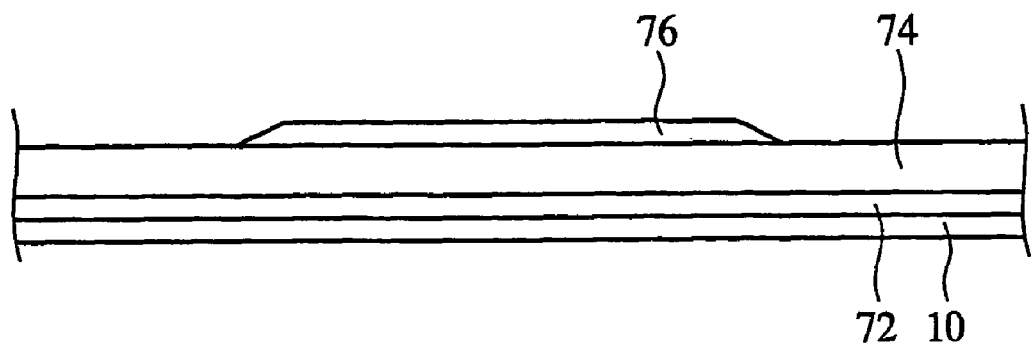
FIG. 18A, FIG. 18B, and FIG. 18C are manufacturing step sectional views (second set of two) illustrating the manufacturing method for the display apparatus according to the sixth embodiment of the present invention.
Figure 18B:
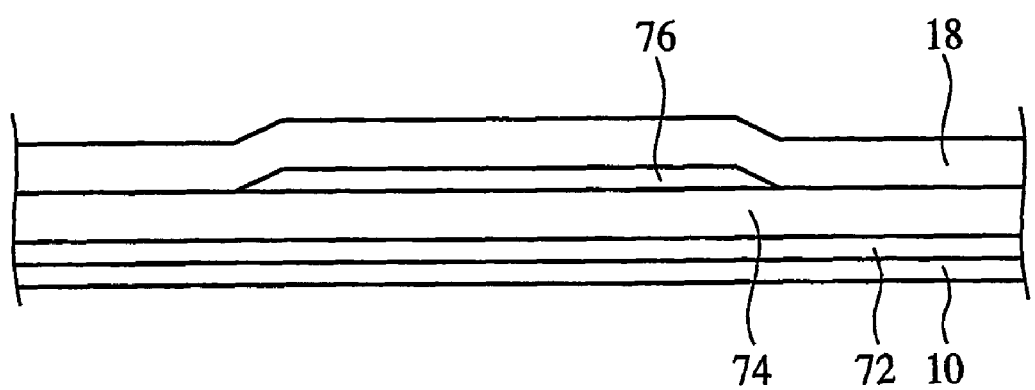
Figure 18C:
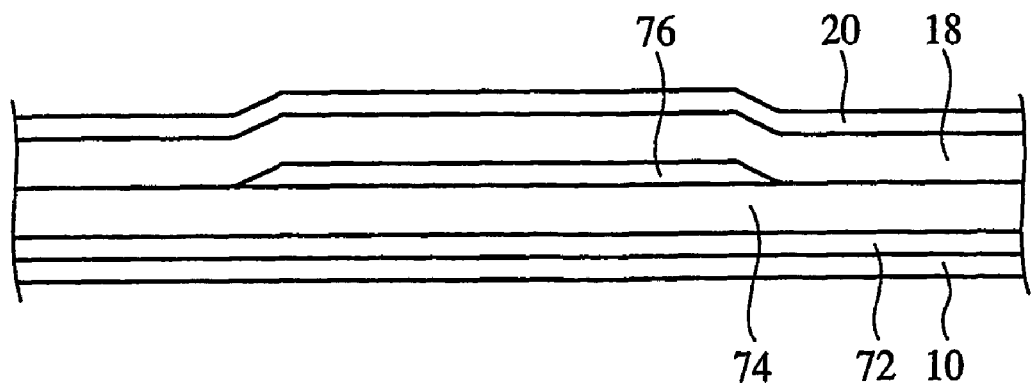

Then, on the insulating layer 74, an ITO film 78 with a film thickness of, for example, 70 nm is formed by, for example, the sputtering method (see FIG. 17C).

Then, by photolithography and etching, the ITO film 78 is patterned to a prescribed geometry. Thus, on the insulating layer 74, the anode electrode 76 made from the ITO film 78 is formed (see FIG. 18A). While the ITO film 78 is patterned, the light reflection film 72 made from an Al film is covered by the insulating layer 74, and the surface thereof will not be exposed. Therefore, corrosion of the light reflection film 72 due to the battery effect can be prevented.

Then, on the insulating layer 74 on which the anode electrode 76 is formed, a 2-TNATA film with a film thickness of, for example, 140 nm; an α-NPD film with a film thickness of, for examples, 10 nm; an Alq$_3$ film doped with, for example, a small amount of t(npa)py with a film thickness of, for example, 30 nm; and Alq$_3$ film with a film thickness of, for example, 20 nm; and an LiF film with a film thickness of, for example, 0.5 nm are sequentially formed by, for example, the vacuum deposition method through a vapor deposition mask which has apertures of a prescribed size.

Thus, on the anode electrode 76, the organic electroluminescence layer 18 having a hole injection layer made from a 2-TNATA film; a hole transportation layer made from an α-NPD film; a luminescence layer made from an Alq$_3$ film doped with t(npa)py; an electron transportation layer made from an Alq$_3$ film; and an electron injection layer made from an LiF film are formed (see FIG. 18B).

Then, on the organic electroluminescence layer 18, an Al film with a film thickness of, for example, 1.5 nm; an Ag film with a film thickness of, for example, 15 nm; and an ITO film with a film thickness of, for example, 35 nm are sequentially formed by, for example, the vacuum deposition method and the sputtering method through a mask which has apertures of a prescribed geometry, for formation of an Al/Ag/ITO laminated film.

Thus, the cathode electrode 20 made from the Al/Ag/ITO laminated film is formed (see FIG. 18C).

Thus, the display apparatus as shown in FIG. 14 is manufactured.

In this way, according to the present embodiment, in the display apparatus using the organic electroluminescence device, the light reflection film 72 having light reflectivity is formed under the anode electrode 76 made from a transparent conductive film through the insulating layer 74 having light transmittance, and thus a top emission type display apparatus having a high luminous efficiency can be realized.

In addition, the light reflection film 72 is covered by the insulating layer 74, and thus degradation of the device characteristics due to the corrosion, or the like, of the light reflection film 72 can be suppressed.

In addition, the organic electroluminescence layer 18 is formed on the anode electrode 76 made from a transparent conductive film as in the conventional organic electroluminescence layer of the same material and structure as those of the organic electroluminescence layer in the conventional organic electroluminescence device can be used as it is.

Also in the display apparatus according to the present embodiment, by providing the region where the light reflection film 72 is formed and the region where the light reflection film 72 is not formed, in the same pixel, in other words, by partially forming the light reflection film 72 in the luminescence region where the anode electrode 76 and the cathode electrode 20 overlap each other, the top emission type region and the double-side emission type region may be provided in the same pixel, as in the display apparatus according to the third embodiment.

In addition, as in the display apparatus according to the fourth embodiment, smooth irregularities may be formed on the surface of the insulating substrate 10 for formation of the light reflection film 72, the insulating layer 74, and the organic electroluminescence device on the insulating substrate 10 on which the smooth irregularities are formed. Or, on the surface of the insulating layer 74, smooth irregularities may be formed for formation of the organic electroluminescence device on the insulating layer 74 on which the smooth irregularities are formed. As in the display apparatus according to the fourth embodiment, the smooth irregularities formed on the surface of the insulating substrate 10 or the insulating layer 74 increases the area of the anode electrode 76, the organic electroluminescence layer 18, and the cathode electrode 20, as compared to that in the case where they are formed on the insulating substrate 10 the surface of which is flat and not provided with irregularities, which can further improve the luminous efficiency.

Seventh Embodiment

Figure 19:
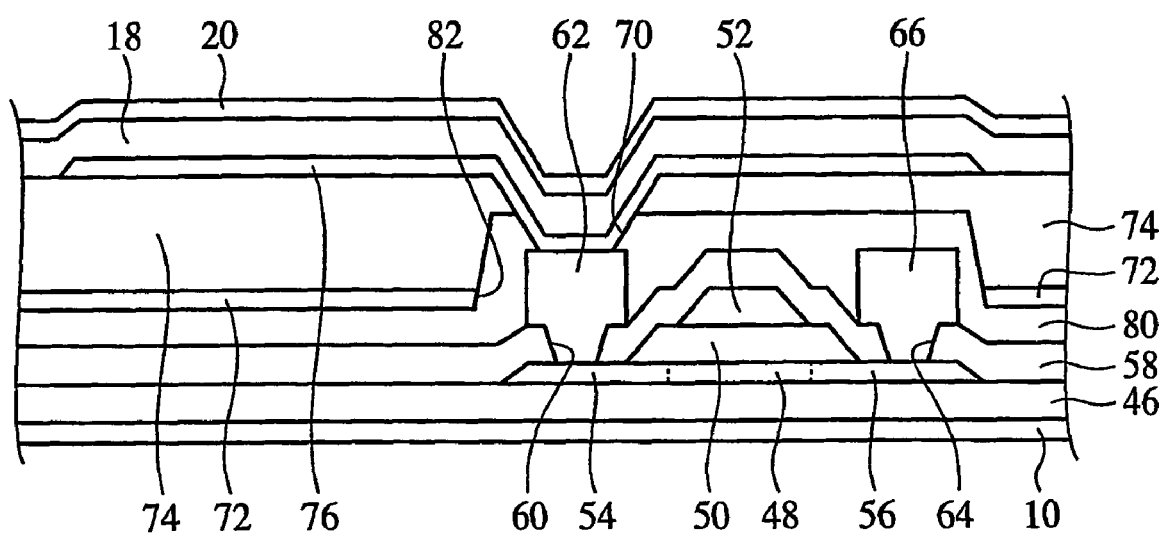
FIG. 19 is a sectional view illustrating the structure of the display apparatus according to a seventh embodiment of the present invention.

The display apparatus and the manufacturing method therefor according to a seventh embodiment of the present invention will be described with reference to FIG. 19 to FIG. 22B. FIG. 19 is a sectional view illustrating the structure of the display apparatus according to the present embodiment, and FIG. 20A to FIG. 22B are manufacturing step sectional views illustrating the manufacturing method for the display apparatus according to the present embodiment. For the same components as those of the display apparatus and the manufacturing method therefor according to the fifth and sixth embodiments as shown in FIG. 10 and FIG. 12A to FIG. 14; and FIG. 17A to FIG. 18C, respectively, the same signs are provided, and explanation is omitted or simplified.

The display apparatus according to the present embodiment is an active matrix type display apparatus which is provided with the same organic electroluminescence device as that in the display apparatus according to the sixth embodiment, and a thin film transistor as a switching device as in the display apparatus according to the fifth embodiment, and with this thin film transistor, controls the driving voltage to be applied to the organic electroluminescence device. Hereinbelow, the structure of the display apparatus according to the present embodiment will be described with reference to FIG. 19. FIG. 19 shows the structure for one pixel, however, actually a plurality of pixels are arranged in the shape of a matrix.

On an insulating substrate 10 made from a glass substrate, as in the display apparatus according to the fifth embodiment a thin film transistor which, through a buffer layer 46 made from a silicon oxide film, has a gate electrode 52, and a source region 54 and a drain region 56 which are formed in a channel layer 48, and which controls the driving voltage to be applied to the organic electroluminescence device is formed.

On the insulating substrate 10 on which the film transistor is formed, an interlayer insulating film 58 is formed. On the interlayer insulating film 58, a source electrode 62 which is connected to the source region 54 through a contact hole 60, and a drain electrode 66 which is connected to the drain region 56 through a contact hole 64 are formed, respectively.

On the interlayer insulating film 58 on which the source electrode 62 and the drain electrode 66 are formed, an interlayer insulating film 80 is formed.

On the interlayer insulating film 80, a light reflection film 72 made from an Al film having light reflectivity is formed. In the light reflection film 72, an aperture part 82 which exposes the region of the interlayer insulating film 80 that is above the thin film transistor is formed. The aperture part 82 which is formed in the light reflection film 72 need not always be that which exposes the region of the interlayer insulating film 80 where the thin film transistor is formed, but bay be that which exposes at least the region of the interlayer insulating film 80 that is above the source electrode 62. The light reflection film 72 in which such an aperture part 82 is formed may be formed for each pixel, being provided with a prescribed geometry, or may be formed over the entire surface of the display region in which the pixels are arranged.

On the light reflection film 72 and the interlayer insulating film 80 which is exposed from the aperture part 82, an insulating layer 74 made from a photosensitive resin having light transmittance is formed. As the photosensitive resin, which is the material for the insulating layer 74, an acryl resin, for example, is used. The insulating layer 74 is formed so as to cover the light reflection film 72, so as not to leave any portion of the surface of the light reflection film 72 bared.

In the insulating layer 74 and the interlayer insulating film 80, a contact hole 70 which reaches the source electrode 62 is formed.

On the insulating layer 74 in which the contact hole 70 is formed, an anode electrode 76 made from a transparent conductive film of ITO having light transmittance is formed in the region including the contact hole 70. The anode electrode 76 is electrically connected to the source electrode 62 of the thin film transistor through the contact hole 70 which is formed in the insulating layer 74 and the interlayer insulating film 80.

On the anode electrode 76, an organic electroluminescence layer 18 in which a hole injection layer, a hole transportation layer, a luminescence layer, an electron transportation layer, and an electron injection layer are sequentially laminated is formed. On the organic electroluminescence layer 18, a cathode electrode 20 in which an Al film formed with a thin film thickness and having light transmittance, an Ag film formed with a thin film thickness and having light transmittance, a transparent conductive film made from an ITO film having light transmittance, a transparent conductive film made from an ITO film having light transmittance are sequentially laminated is formed. Thus, on the light reflection film 72, the organic electroluminescence device having the anode electrode 76, the organic electroluminescence layer 18, and the cathode electrode 20 is formed through the insulating layer 74.

The display apparatus according to the present embodiment is of top emission type, in which the existence of the light reflection film 72 which is formed under the anode electrode 76 made from a transparent conductive film through the insulating layer 74 having light transmittance allows the light to be taken out from the cathode electrode 20 side at the side opposite to the insulating substrate 10. Therefore, the luminescence area will not be limited by the thin film transistor formed above the insulating substrate 10, thereby allowing a high luminous efficiency to be realized.

In addition, in the display apparatus according to the present embodiment, the aperture part 82 which exposes at least the region of the interlayer insulating film 80 that is above the source electrode 62 is formed in the light reflection film 72, and the anode electrode 76 made from a transparent conductive film is directly electrically connected to the source electrode 62 through the contact hole 70. Thereby, without passing through a conductive film which is difficult to secure the electrical connection to the anode electrode 76, holes can be injected from the light reflection film 72 which is electrically connected to the source electrode 62 of the thin film transistor, into the organic electroluminescence layer 18. In addition, the insulating layer 74 is formed so as to cover the light reflection film 72, and thus corrosion of the light reflection film 72 can be prevented. In addition, as the organic electroluminescence layer 18, the organic electroluminescence layer in the conventional organic electroluminescence device can be used as it is.

In the case where the light reflection film 72 which is provided with a prescribed geometry is to be formed for each pixel, it is preferable that the light reflection film 72 is formed so as to be wider than the luminescence region where the anode electrode 76 and the cathode electrode 20 overlap each other. By thus forming the light reflection 72 so as to be wider, it can be suppressed that the luminescence of the organic electroluminescence device affects the characteristics of the thin film transistor.

Next, the manufacturing method for the display apparatus according to the present embodiment will be described with reference to FIG. 20A to FIG. 22B.

Figure 20A:
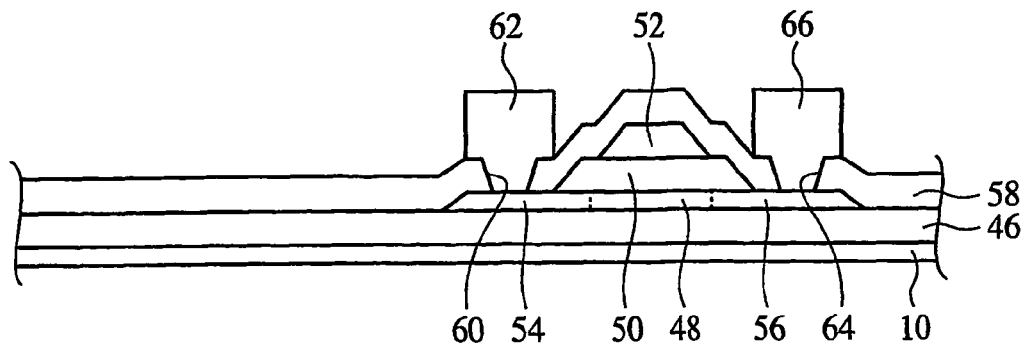
FIG. 20A, FIG. 20B, and FIG. 20C are manufacturing step sectional views (first set of three) illustrating the manufacturing method for the display apparatus according to the seventh embodiment of the present invention.

Firstly, as in the manufacturing method for the display apparatus according to the fifth embodiment as shown in FIG. 12A to FIG. 12C, and FIG. 13A, on the insulating substrate 10, the components up to the thin film transistor, the source electrode 62 and the drain electrode 66 are formed (see FIG. 20A).

Figure 20B:
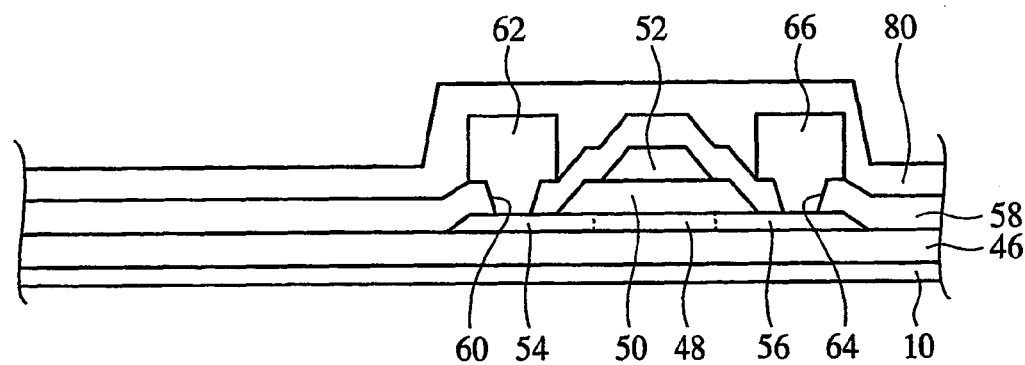
Figure 20C:
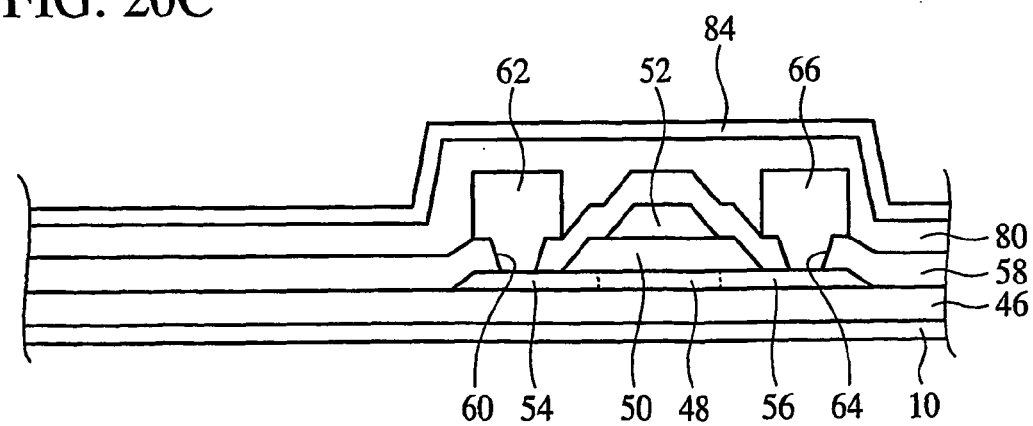

Then, by, for example, the CVD method, on the interlayer insulating film 58 in which the source electrode 62 and drain electrode 66 are formed, the interlayer insulating film 80 made from a silicon oxide film with a film thickness of, for example, 300 nm is formed (see FIG. 20B). As the interlayer insulating film 80, an inorganic insulating film, such as a silicon nitride film as well as a silicon oxide film, or an insulating film made from a resin can be used.

Then, on the interlayer insulating film 80, an Al film 84 with a film thickness of, for example, 150 nm is formed by, for example, the sputtering method.

Figure 21A:
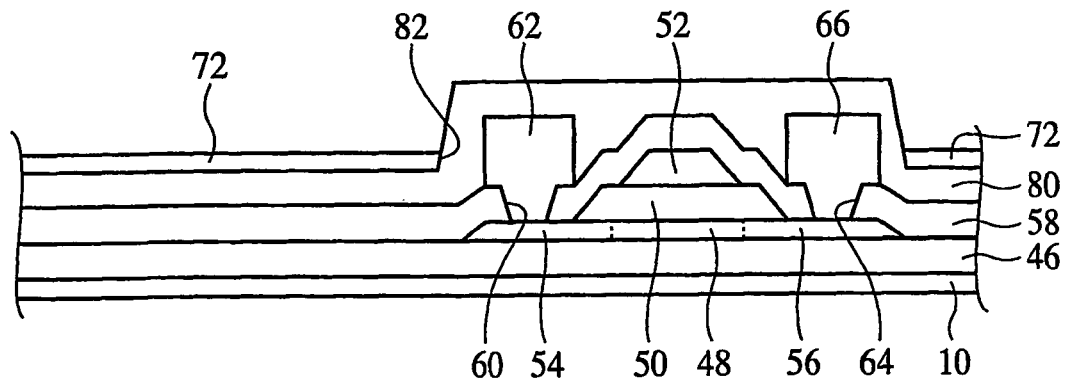
FIG. 21A, FIG. 21B, and FIG. 21C are manufacturing step sectional views (second set of three) illustrating the manufacturing method for the display apparatus according to the seventh embodiment of the present invention.

Then, by lithography, the Al film 84 is patterned to a prescribed geometry for formation of the aperture part 82 which exposes at least the region of the interlayer insulating film 80 that is above the source electrode 62, in the Al film 84. The Al film 84 may be patterned such that a prescribed geometry is provided for each pixel, or may be left over the entire surface of the display region in which the pixels are arranged. Thus, the light reflection film 72 made from the Al film 84 is formed (see FIG. 21A). FIG. 21A shows the case where the aperture part 82 which exposes the region of the interlayer insulating film 80 that is above the thin film transistor is formed in the light reflection film 72.

Figure 21B:
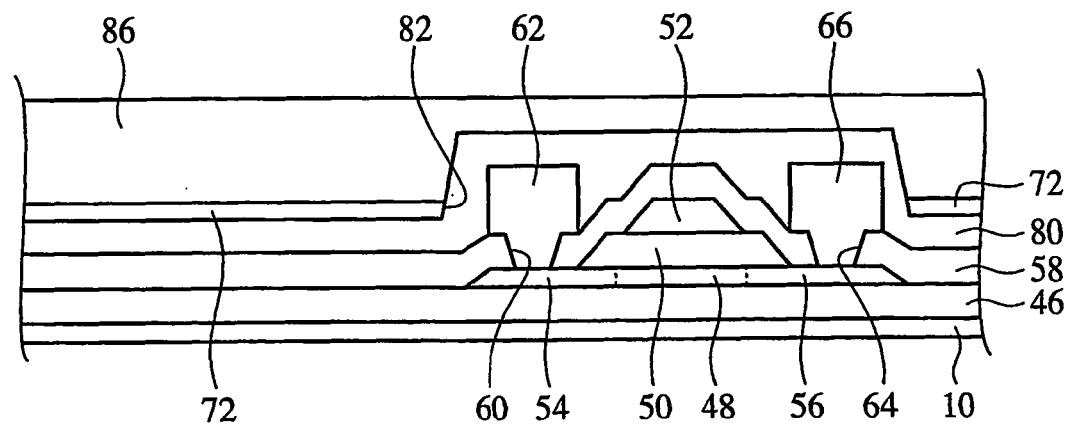
Figure 21C:
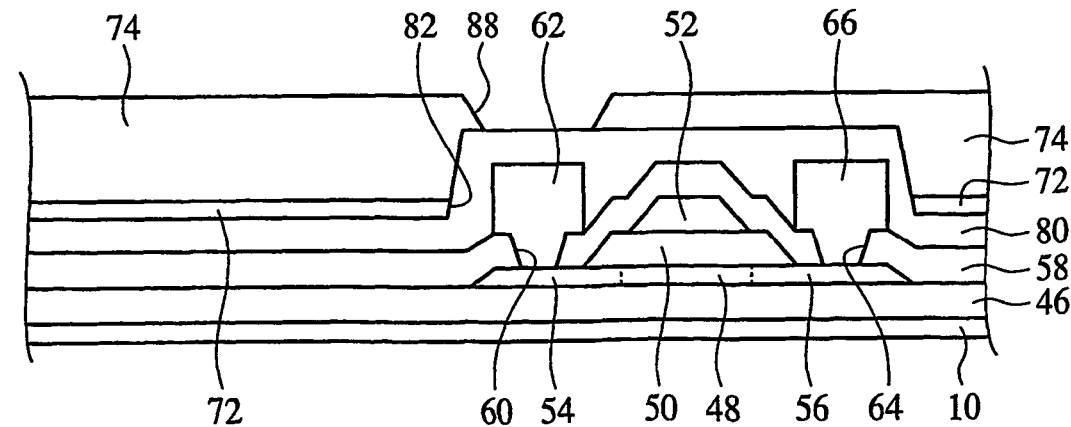

Then, to the light reflection film 72 and the interlayer insulating film 80 which is exposed from the aperture part 82, a photosensitive resin is applied by, for example, the spin coating method for formation of a photosensitive resin layer 86 (see FIG. 21B).

After exposing the photosensitive resin layer 86 with a prescribed mask, the photosensitive resin layer 86 which has been exposed is developed with a prescribed developing solution for formation of the aperture part 88 that exposes the region of the interlayer insulating film 80 that is above the source electrode 62, in the photosensitive resin layer 86. Thus, by photolithography, the insulating layer 74 made from the photosensitive resin layer 86 having light transmittance in which the aperture part 88 has been formed is formed (see FIG. 21C). Herein, the insulating layer 74 is formed so as to cover the light reflection film 72, so as not to leave any portion of the surface of the light reflection film 72 bared.

Then, by, for example, dry etching, an aperture part 90 which reaches the source electrode 62 is formed in the interlayer insulating film 80, using the insulating layer 74 in which the aperture part 88 has been formed, as a mask.

Figure 22A:
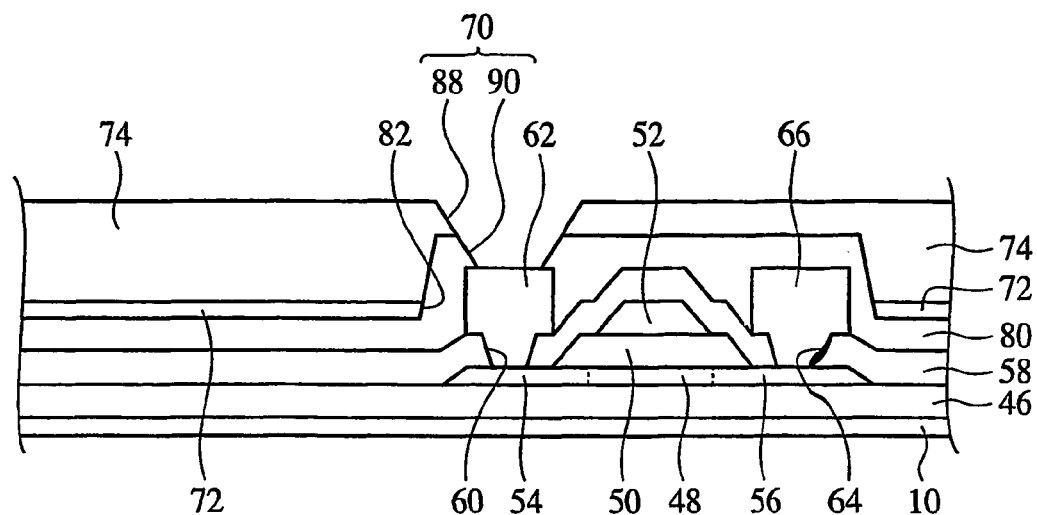
FIG. 22A and FIG. 22B are manufacturing step sectional views (third set of three) illustrating the manufacturing method for the display apparatus according to the seventh embodiment of the present invention.

Thus, the contact hole 70 which is produced by connection between the aperture part 90 which has been formed in the interlayer insulating film 80 and the aperture part 88 which has been formed in the insulating layer 74 is formed (see FIG. 22A). For the contact hole 70, it is preferable that the size of the aperture part 82 in the light reflection film 72; the size of the aperture part 88 of the insulating layer 74; the etching conditions, and the like, be previously set as appropriate in order to prevent the light reflection film 72 from being exposed. This is for the following reason; if the light reflection film 72 is exposed in the contact hole 70, the anode electrode 76 which is subsequently formed is contacted with the light reflection film 72, resulting in a parasitic capacitance being formed between both, which leads to degradation of the device characteristics, and thus such a parasitic capacitance should be avoided.

In this way, in the manufacturing method for the display apparatus according to the present embodiment, the insulating layer 74 is formed with a photosensitive resin, and the insulating layer 74 is also used as a mask in etching the interlayer insulating film 80, and thus the components up to the contact hole 70 can be formed with a smaller number of manufacturing steps. As the insulating layer 74, an inorganic insulating film having light transmittance, such as a silicon oxide film, or the like, can be used. In this case, in addition to the manufacturing step of forming the insulating layer 74 made from an inorganic insulating film, the manufacturing step of forming a resist film for use as an etching mask for formation of the contact hole 70 in the insulating layer 74 and the interlayer insulating film 80, and the manufacturing step of removing the resist film are also required. Therefore, the number of manufacturing steps is increased, as compared to the case where the insulating layer 74 is formed with a photosensitive resin.

Figure 22B:
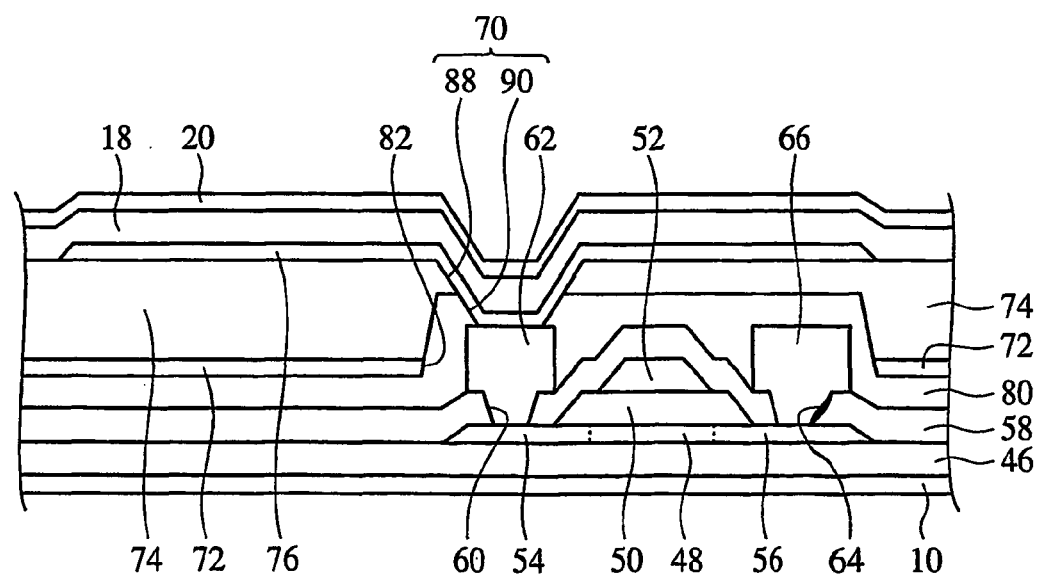

Then, on the insulating film 74 in which the contact hole 70 is formed, the anode electrode 76 which is connected to the source electrode 62 through the contact hole 70, the organic electroluminescence layer 18, and the cathode 20 are formed, as in the manufacturing method for the display apparatus according to the sixth embodiment (see FIG. 22B).

Thus, the display apparatus according to the present embodiment as shown in FIG. 19 is manufactured.

In this way, according to the present embodiment, in the display apparatus using the organic electroluminescence device, the light reflection film 72 having light reflectivity is formed under the anode electrode 76 made from a transparent conductive film through the insulating layer 74 having light transmittance, and thus a top emission type display apparatus having a high luminous efficiency can be realized, without undergoing any limitation by the thin film transistor formed under the organic electroluminescence device.

In addition, the light reflection film 72 is covered by the insulating layer 74, and thus degradation of the device characteristics due to the corrosion, or the like, of the light reflection film 72 can be suppressed.

Further, the organic electroluminescence layer 18 is formed on the anode electrode 76 made from a transparent conductive film as in the conventional organic electroluminescence device, and thus as the organic electroluminescence layer 18, the organic electroluminescence layer of the same material and structure as those of the organic electroluminescence layer in the conventional organic electroluminescence device can be used as it is.

Variant Embodiment

The present invention is not limited to the embodiments as described above, and a variety of modifications are possible.

For example, in the embodiments as described above, the case where a glass substrate is used as the insulating substrate 10 has been described, however, the insulating substrate 10 is not limited to the glass substrate. For example, a resin film of polycarbonate, polyethylene terephthalate, or the like, may be used as the insulating substrate 10. By using a resin film as the insulating substrate 10, a flexible display apparatus having flexibility can be realized. In addition, in the case where only the top emission type display apparatus is to be configured, the insulating substrate 10 need not always be that which has light transmittance, as the glass substrate, or the like. However, as in the display apparatus according to the third embodiment, in the case where a top emission part 40 and a double-side emission part 44 are to be provided on the same substrate, it is required that a substrate having light transmittance be used as the insulating substrate 10.

In addition, in the embodiments as described above, the case where an intervening film 30 is formed on the peripheral edge portion of the light reflection film 12 has been described, however, the intervening film 30 need not always be formed on the peripheral edge portion of the light reflection film 12, but it may be partially formed on a prescribed region of the light reflection film 12.

In addition, in the embodiments as described above, the case where an Al film is used as the light reflection films 12 and 72 for reflecting the light generated in the luminescence layer in the organic electroluminescence layer 18 to the cathode electrode 20 side has been described, however, the light reflection films 12 and 72 is not limited to the Al film. As the light reflection films 12 and 72, a conductive film having light reflectivity, made from, for example, Ag, Nd (neodymium), Si (silicon), Ti, W (tungsten), Cu (copper), Nb (niobium), Ta (tantalum), C (carbon), or an alloy including at least any one of these as a main component, as well as Al or an alloy including Al as a main component, can be used.

In addition, in the embodiments as described above, the case where an Mo film is used as the intervening film 30 for improving the electrical connection between the light reflection film 12 made from an Al film and the transparent conductive film 14 made from an ITO film to secure the continuity between both has been described, but the intervening film 30 is not limited to the Mo film. As the intervening film 30, a conductive film made from a high-melting point metal, such as W, Ta, Ti, Cr, or an alloy including at least any one of these as a main component, as well as Mo or an alloy including Mo as a main component, can be used.

In addition, in the embodiments as described above, the case where an ITO film is used as the transparent conductive film 14 which is formed on the light reflection film 12 or the anode electrode 76, have been described, however, the transparent conductive film 14 and the anode electrode 76 are not limited to the ITO film. As the transparent conductive film 14, a conductive film having light transmittance, such as an IZO (indium oxide doped with zinc) film, a ZnO (zinc oxide) film, or the like, as well as the ITO film, can be used.

In addition, in the embodiments as described above, the case where, as the organic electroluminescence layer 18, that in which a hole injection layer made from a 2-TNATA film; a hole transportation layer made from an α-NPD film; a luminescence layer made from an $Alq_3$ film doped with t(npa)py; an electron transportation layer made from an $Alq_3$ film; and an electron injection layer made from an LiF film are sequentially laminated is used has been described, however, the structure and material for the organic electroluminescence layer 18 is not limited to this. As the structure of the organic electroluminescence layer 18, the single-layer structure having only the luminescence layer; the 2-layer structure having a hole transportation layer and a luminescence layer, or a luminescence layer and an electron transportation layer; and the 3-layer structure having a hole transportation layer, a luminescence layer, and an electron transportation layer can be applied. In addition, as the material for the hole injection layer, the hole transportation layer, the luminescence layer, the electron transportation layer, and the electron injection layer constituting the organic electroluminescence layer 18, any organic electroluminescence material can be used.

In addition, in the embodiments as described above, the case where, as the cathode electrode 20, an Al/ITO laminated film or an Al/Ag/ITO laminated film is used has been described, however, the cathode electrode 20 is not limited to the Al/ITO laminated film or the Al/Ag/ITO laminated film. As the cathode electrode 20, a conductive film having light transmittance, such as an ITO single film, and IZO film, a ZnO film, an Al single film, an Ag single film, or a laminated film of these, as well as the Al/ITO laminated film or the Al/Ag/ITO laminated film, can be used. In the case where an Al film, an Ag film, or the like, is to be used as the cathode electrode 20, it is required that the film be formed so as to be thin in order to provide light transmittance.

In addition, in the embodiments as described above, the case where, as the insulating layer 74, that made from a photosensitive resin is used has been described, however, the insulating layer 74 is not limited to that made from a photosensitive resin, provided that it has light transmittance. As the insulating layer 74, an inorganic insulating film having light transmittance, such as a silicon oxide film, a silicon nitride film, a silicon nitride-oxide film or the like, can be used as well as that made from a photosensitive resin. In addition, the insulating layer 74 need not be colorless, provided that it has light transmittance, and as the insulating layer 74, that made from a colored resin, such as polyimide, or the like, can be used.

In addition, in the embodiments as described above, the case where, as the thin film transistor, that of top gate type is used has been described, however, as the thin film transistor, a bottom gate type one may be used. In addition, the case where, as the channel layer 48, a polysilicon film is used has been described, however, as the channel layer 48, an amorphous silicon film may be used.

In addition, in the embodiments as described above, the case where, as the switching device, a thin film transistor is used has been described, however, other types of switching device may be used. For example, a switching device of MIM (metal-insulating film-metal) structure that utilizes a diode, which is a two-terminal device, may be used.

INDUSTRIAL APPLICABILITY

The organic electroluminescence device and the manufacturing method therefor as well as the display apparatus according to the present invention realize an organic electroluminescence device excellent in luminous efficiency and the manufacturing device. Therefore, the present invention is useful for application to a display apparatus which is excellent in display characteristics, and is low in power consumption.

What is claimed is:

1. An organic electroluminescence device, comprising:
    an anode electrode comprising a first conductive film which is formed on a substrate and has light reflectivity, a second conductive film which has light transmittance and is formed on the first conductive film so as to be wider than the first conductive film and so as to cover the first conductive film, and a third conductive film which is partially formed between the first conductive film and the second conductive film and is electrically connected to each of the first conductive film and the second conductive film;
    an organic electroluminescence layer which is formed on the anode electrode; and
    a cathode electrode which is formed on the organic electroluminescence layer and has light transmittance,
    wherein the third conductive film is in direct contact with each of the first conductive film and the second conductive film.

2. The organic electroluminescence device of claim 1, wherein the third conductive film is formed on a peripheral edge portion of the first conductive film.

3. The organic electroluminescence device of claim 1, wherein the third conductive film comprises Mo, W, Ta, Ti, Cr, or an alloy comprising at least any one of these as a main component.

4. The organic electroluminescence device of claim 1, wherein the first conductive film is partially formed in a luminescence region where the anode electrode and the cathode electrode overlap each other.

5. The organic electroluminescence device of claim 1, wherein irregularities are formed on a surface of the substrate.

6. The organic electroluminescence device of claim 1, wherein the first conductive film comprises Al, Ag, Nd, Si, Ti, W, Cu, Nb, Ta, C, or an alloy comprising at least any one of these as a main component.

7. The organic electroluminescence device of claim 1, wherein the second conductive film comprises ITO, IZO, or ZnO.

8. A display apparatus, comprising the organic electroluminescence device of claim 1 in the pixel region.

9. The display apparatus of claim 8, further comprising a switching device which is formed on the substrate and controls a driving voltage which is applied to the organic electroluminescence device.

10. A manufacturing method for an organic electroluminescence device, comprising steps of:
    forming, on a substrate, an anode electrode which comprises a first conductive film having light reflectivity, and a second conductive film which has light transmittance and is formed on the first conductive film so as to be wider than the first conductive film and so as to cover the first conductive film, and a third conductive film which is electrically connected to each of the first conductive film and the second conductive film and is partially formed on the first conductive film before the second conductive film is formed;
    forming an organic electroluminescence layer on the anode electrode; and
    forming a cathode electrode having light transmittance on the organic electroluminescence layer,
    wherein the third conductive film is in direct contact with each of the first conductive film and the second conductive film.

11. The manufacturing method for an organic electroluminescence device of claim 10, wherein the step of forming the anode electrode comprises:
    a step of forming the third conductive film on the first conductive film;
    a step of forming a resist film on the third conductive film, and partially varying the film thickness of the resist film;
    a step of etching the third conductive film and the first conductive film, using the resist film of which the film thickness has been varied, as a mask;
    a step of removing a portion of the resist film that is thinner in film thickness to form an aperture part in the resist film; and
    a step of etching the third conductive film which is exposed at the bottom in the aperture part, using the resist film in which the aperture part has been formed, as a mask, to partially form the third conductive film on the first conductive film.

12. The manufacturing method for an organic electroluminescence device of claim 11, wherein, at the step of partially varying the film thickness of the resist film, an exposure amount of the resist film is partially changed to vary the film thickness of the resist film.

13. The manufacturing method for an organic electroluminescence device of claim 10, wherein, at the step of partially forming the third conductive film, the third conductive film is formed on a peripheral edge portion of the first conductive film.

14. A manufacturing method for a display apparatus, comprising steps of:
    forming a switching device on a substrate;
    forming a first insulating layer on the substrate on which the switching device is formed;
    forming a first conductive film having light reflectivity on the first insulating layer;
    forming, on the first insulating layer on which the first conductive film is formed, a second insulating layer which has a first aperture part above an electrode of the switching device and is made from a photosensitive resin and has light transmittance;

etching the first insulating layer using the second insulating layer as a mask to form a second aperture part which reaches the electrode of the switching device;

forming, on the second insulating layer, an anode electrode which is electrically connected to the electrode of the switching device through the first aperture part and the second aperture part, and comprises a second conductive film having light transmittance;

forming an organic electroluminescence layer on the anode electrode; and forming a cathode electrode having light transmittance on the organic electroluminescence layer, wherein, at the step of forming the anode electrode, a third conductive film which is electrically connected to each of the first conductive film and the second conductive film is partially formed on the first conductive film before the second conductive film is fondled, and the third conductive film is in direct contact with each of the first conductive film and the second conductive film.

* * * * *